(12) United States Patent
Lee et al.

(10) Patent No.: US 12,002,755 B2
(45) Date of Patent: Jun. 4, 2024

(54) METALLIZATION LAYER AND FABRICATION METHOD

(71) Applicant: Taiwan Semiconductor Manufacturing Co., Ltd., Hsinchu (TW)

(72) Inventors: I-Che Lee, Hsinchu (TW); Huai-Ying Huang, Jhonghe (TW); Ruei-Cheng Shiu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 436 days.

(21) Appl. No.: 17/308,404

(22) Filed: May 5, 2021

(65) Prior Publication Data

US 2022/0238438 A1 Jul. 28, 2022

Related U.S. Application Data

(60) Provisional application No. 63/142,574, filed on Jan. 28, 2021.

(51) Int. Cl.
*H01L 21/768* (2006.01)
*H01L 23/522* (2006.01)
(Continued)

(52) U.S. Cl.
CPC .... *H01L 23/5283* (2013.01); *H01L 21/76807* (2013.01); *H01L 21/7684* (2013.01);
(Continued)

(58) Field of Classification Search
CPC ......... H01L 21/76877; H01L 21/76886; H01L 21/76888
See application file for complete search history.

(56) References Cited

U.S. PATENT DOCUMENTS 5,385,868 A * 1/1995 Chao ................ H01L 21/76877
    438/637
10,636,659 B2 * 4/2020 Chen ................... H01L 21/0338
(Continued)

FOREIGN PATENT DOCUMENTS

JP     2000216239 A     8/2000

OTHER PUBLICATIONS

Liu et al. "Temperature-controlled self-assembled synthesis of CuO, Cu2O and Cu nanoparticles through a single-precursor route" Materials Science and Engineering A 448 (2007) 7-14, published on Mar. 15, 2007.
(Continued)

*Primary Examiner* — Peter M Albrecht
(74) *Attorney, Agent, or Firm* — Eschweiler & Potashnik, LLC

(57) ABSTRACT

A second metal structure such as a metal plug is formed over a first metal structure, such as a metal line, by causing metal material from the first metal structure to migrate into an opening in a dielectric layer over the first metal structure. The metal material, which may be copper, is of a type that undergoes a reduction in density as it oxidizes. Migration is induced using gases that alternately oxidize and reduce the metal material. Over many cycles, the metal material migrates into the opening. In some embodiments, the migrated metal material partially fills the opening. In some embodiments, the migrated metal material completely fills the opening.

20 Claims, 14 Drawing Sheets

(51) Int. Cl.
  *H01L 23/528*  (2006.01)
  *H01L 23/532*  (2006.01)
  *H01L 25/18*   (2023.01)
(52) U.S. Cl.
  CPC .. *H01L 21/76843* (2013.01); *H01L 21/76883* (2013.01); *H01L 21/76888* (2013.01); *H01L 23/5226* (2013.01); *H01L 23/53238* (2013.01); *H01L 25/18* (2013.01)

(56) References Cited

U.S. PATENT DOCUMENTS

| | | |
|---|---|---|
| 2003/0068895 A1 | 4/2003 | Kim |
| 2004/0043593 A1 | 3/2004 | Ikeda et al. |
| 2010/0301480 A1* | 12/2010 | Choi ............... H10B 61/22 257/751 |
| 2013/0153888 A1 | 6/2013 | Inoue et al. |
| 2018/0040817 A1* | 2/2018 | Chuang ............ H10B 61/22 |
| 2019/0164887 A1 | 5/2019 | Wang et al. |

OTHER PUBLICATIONS

Chowdhury et al. "Electrical and Optical Properties of Cupric Oxide (CuO) and Yttrium Oxide (Y2O3)" Nuclear Science and Applications (1989); ISSN 1016-197X; Worldcat; v. 16(2); p. 43-49, published in 1989.

* cited by examiner

METALLIZATION LAYER AND FABRICATION METHOD

REFERENCE TO RELATED APPLICATION

This application claims the benefit of U.S. Provisional Application No. 63/142,574, filed on Jan. 28, 2021, the contents of which are incorporated herein by reference in their entirety.

BACKGROUND

The integrated circuit (IC) manufacturing industry has experienced exponential growth over the last few decades. As ICs have evolved, functional density (i.e., the number of interconnected devices per chip area) has increased while feature sizes have decreased. Other advances have included the introduction of embedded memory technology and high-κ metal gate (HKMG) technology. Embedded memory technology is the integration of memory devices with logic devices on the same semiconductor chip. The memory devices support operation of the logic devices and improve performance in comparison to using separate chips for the different types of devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
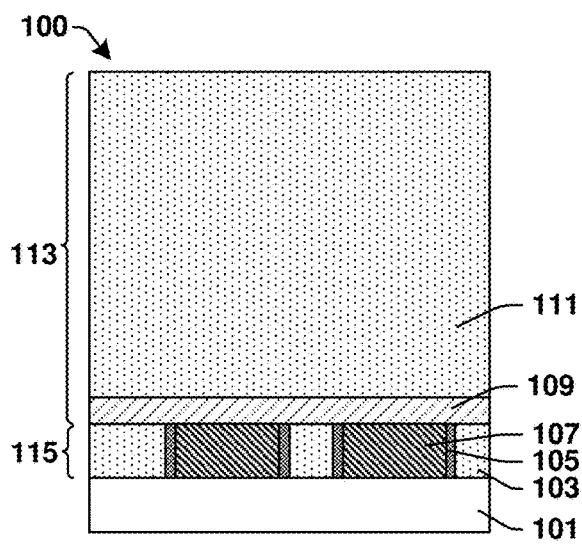
FIGS. 1-10 are a series of cross-sectional view illustrations exemplifying a method of forming a device according to some embodiments the present teachings.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides a method that may be used to form a second metal structure, such as a metal plug or a second metal line, over a first metal structure, such as a first metal line. According to the method, an opening is formed in a dielectric layer over the first metal structure. A gas is introduced that interacts with the first metal structure where it is exposed within the opening. The interaction causes metal material from the first metal structure to migrate into the opening where it forms the second metal structure. In some embodiments, the migrated material partially fills the opening. In some embodiments, the migrated material completely fills the opening. In some embodiments, the method further includes chemical mechanical polishing (CMP). In some embodiments, the CMP removes migrated material outside the opening. In some embodiments, the CMP eliminates an upper portion of the opening that the migrated material has not filled.

In some embodiments, the gas causes both oxidation and reduction reactions. The oxidation reactions increase an oxygen content of the metal material. The oxidation causes a density of the material to decrease. The reduction in density leads to an expansion of the material into the opening. The reduction reactions reverse or partially reverse the oxidation. As the material is reduced, it does not return entirely to its original location. The material undergoes many alternations of oxidation and reduction. The overall effect is a gradual infusion of oxygen progressively deeper into the structures and a gradual growth of the material progressively higher into the opening.

In some embodiments, the second metal structure will have a higher oxygen concentration than the first metal structure. In some embodiments, the second metal structure will have an oxygen concentration gradient. A density of the second metal structure varies in relationship with the oxygen concentration gradient. In some embodiments, an oxygen concentration at a middle height of the second metal structure is higher than an oxygen concentration at a base of the second metal structure. In some embodiments, the oxygen concentration gradient entails a continuous increase in oxygen concentration from a bottom of the second metal structure to a middle height or a top of the second metal structure.

In some embodiments, a rate of oxygen concentration variation is higher at a base of the second metal structure than at a middle height of the second metal structure. In some embodiments, an annealing process is carried out to reduce or eliminate the oxygen concentration gradient within the second metal structure.

In some embodiments, a mixture of one or more gases produces both the oxidation and the reduction reactions. In some embodiments, the mixture comprises a hydrogen-containing compound. In some embodiments, the mixture comprises an oxygen-containing compound. In some embodiments, the mixture comprises a compound that contains hydrogen and oxygen. In some embodiments, the mixture comprises water ($H_2O$). Water can cause both oxidation and reduction. In some embodiments, the mixture comprises hydrogen ($H_2$). The exceptionally high diffusion rate of hydrogen can facilitate reduction below an outer surface of the material. Oxygen may also penetrate the material through solid diffusion. A variety of compounds can provide the oxygen. In some embodiments, the mixture comprises one or more of oxygen ($O_2$), a nitrogen-oxygen compound such as nitrous oxide ($N_2O$), nitric oxide (NO), dinitrogen oxide ($N_2O_2$), nitrogen dioxide ($NO_2$), carbon monoxide (CO), carbon dioxide ($CO_2$), hydrogen peroxide ($H_2O_2$), or the like.

The method of the present disclosure may provide an additional advantage in that the second metal structure does not require a diffusion barrier layer due to the second metal structure being formed at lower temperatures as compared to metal structures formed by other processes such as ALD, PVD, or CVD. In some embodiments, the method is carried out at a temperature in the range from 50° C. to 200° C. In some embodiments, the method is carried out at a temperature in the range from 75° C. to 150° C. In some embodiments, the metal is copper or the like for which a diffusion barrier is normally employed. In some embodiments, the dielectric layer is a low-κ dielectric layer. In some embodiments, the dielectric layer is an extremely low-κ dielectric layer. The absence of the diffusion barrier layer leaves more area for the second metal structure.

When produced according to the present teachings, the second metal structure may be without voids or have fewer voids than if produced by a method such as atomic layer deposition (ALD), physical vapor deposition (PVD), or chemical vapor deposition (CVD) particularly if the opening has a high aspect ratio or a low critical dimension. In some embodiments, the second metal structure has a width or diameter that is in the range from 5 nm to 100 nm. In some embodiments, the second metal structure has a width or diameter that is in the range from 10 nm to 50 nm.

In some embodiments, a metallization layer is disposed above the second metal structure. In some embodiments, the second metal structure makes a connection with the metallization layer. The metallization layer may comprise metal lines or vias that are of the same material as the second metal structure but have a lower oxygen concentration. The metal lines and vias may be separated from a surrounding dielectric by a diffusion barrier layer while the second metal structure is not surrounded by a diffusion barrier layer.

The second metal structure may be one of a plurality of second metal structures. In some embodiments, the plurality of second metal structures provides an intermediate metallization layer within a metal interconnect structure. For example, the intermediate metallization layer may be between a third metallization layer (M3) and a fourth metallization layer (M4), a fourth metallization layer (M4) and a fifth metallization layer (M5), a fifth metallization layer (M5) and a sixth metallization layer (M6), or between any other pair of metallization layers. In some embodiments, the intermediate metallization layer is thinner than the metallization layer that is below it.

In some embodiments, the second metal structure is of a type formed by a dual damascene process. In some embodiments, the second metal structure has a lower portion that is a via and an upper portion that is a line or a via having a greater width than the lower portion. The upper portion may be filled with material that migrates through the lower portion and has its source in an underlying first metal structure. A line of the upper portion may extend between multiple vias of the lower portion. The span of such a line between vias of the lower portion is limited.

In some embodiments, an array of memory cells is at a same height above a substrate as the intermediate metallization layer. In some embodiments, the intermediate metallization layer has an upper surface coplanar with upper surfaces of top electrodes of the memory cells. In some embodiments, top electrodes of the memory cells are vertically aligned with an etch stop or CMP stop layer and upper surfaces of the second metal structures are also vertically aligned with the etch stop or the CMP stop layer. In some embodiments, a CMP process that exposes the top electrodes of the memory cells also planarizes an upper surface of the second metal structure FIGS. 1 through 10 provide a series of cross-sectional view illustrations 100-1000 exemplifying a method according to the present teachings of forming a second metal structure over a first metal structure. While FIGS. 1 through 10 are described with reference to various embodiments of a method, it will be appreciated that the structures shown in FIGS. 1 through 10 are not limited to the method but rather may stand alone separate from the method. While FIGS. 1 through 10 are described as a series of acts, it will be appreciated that the order of the acts may be altered in other embodiments. While FIGS. 1 through 10 illustrate and describe a specific set of acts, some acts that are illustrated and/or described may be omitted in other embodiments. Further, acts that are not illustrated and/or described may be included in other embodiments.

As shown by the cross-sectional view 100 of FIG. 1, the method may begin with provision of a substrate 101 on which there is a first metal structure comprising metal lines 107. The metal lines 107 may be disposed within an interlevel dielectric layer 103. In accordance with some embodiments, a diffusion barrier layer 105 separates the metal lines 107 from the interlevel dielectric layer 103. The metal lines 107 and the interlevel dielectric layer 103 may constitute a metallization layer 115 over the substrate 101. In accordance with the method, a dielectric layer 113 is formed over the metallization layer 115 including the metal lines 107. The dielectric layer 113 may include a plurality of layers such as an interlevel dielectric layer 111 and an etch stop layer 109. The dielectric layer 113 may be formed by one or more processes such as physical vapor deposition (PVD), chemical vapor deposition (CVD), plasma-enhanced chemical vapor deposition (PECVD), atomic layer deposition (ALD), sputtering, or the like.

The substrate 101 may be any type of substrate. In some embodiments, the substrate 101 comprises a semiconductor body, e.g., silicon, SiGe, silicon-on-insulator (SOI), or the like. The substrate 101 may be a semiconductor wafer, one or more dies on a wafer, or any other type of semiconductor body and/or epitaxial layers associated therewith. The metal lines 107 may be any suitable metal material. A suitable metal material may be copper (Cu), silver (Ag), or another metal that is a good conductor, may be oxidized without too much difficulty, and undergoes a reduction in density upon oxidation. The diffusion barrier layer 105 may be, for example a compound of a transition metal such as tantalum nitride, titanium nitride, tungsten nitride, or the like. The etch stop layer 109 may be, for example, silicon nitride (SiN), silicon carbide (SiC), silicon carbonitride (SiCN), silicon oxycarbide (SiOC), silicon oxycarbonitiride (SiOCN), a combination thereof, or the like.

The interlevel dielectric layer 103 and the interlevel dielectric layer 111 may have any suitable dielectric compositions. In some embodiments, they have the same dielectric composition. The interlevel dielectric layer 103 and the interlevel dielectric layer 111 may be silicon dioxide ($SiO_2$) or the like. In some embodiments, the interlevel dielectric layer 103, the interlevel dielectric layer 111, or both are low-κ dielectrics. A low-k dielectric is a material having a smaller dielectric constant than $SiO_2$. $SiO_2$ has a dielectric constant of about 3.9. Examples of low-k dielectrics include, without limitation, organosilicate glasses (OSG) such as carbon-doped silicon dioxide, fluorine-doped silicon dioxide (FSG), organic polymer low-k dielectrics, porous silicate glass, and the like. In some embodiments, the interlevel dielectric layer 103, the interlevel dielectric layer 111, or both are extremely low-κ dielectrics. An extremely low-k dielectric is a material having a dielectric constant of about 2.1 or less. An extremely low-k dielectric may be a low-k dielectric with additional porosity.

Figure 2:
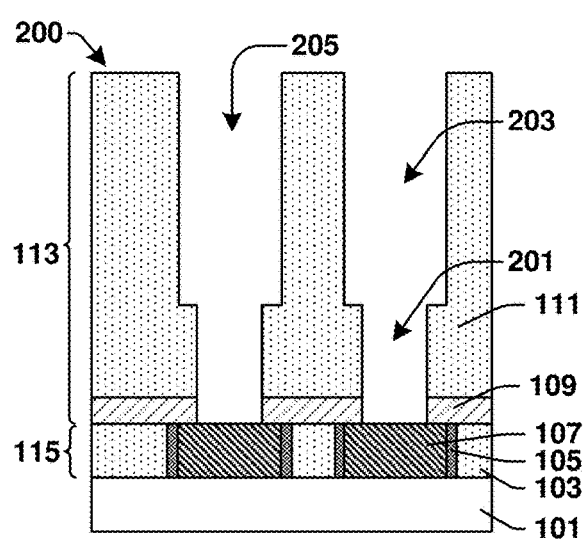

As shown by the cross-sectional view 200 of FIG. 2, the method continues with forming openings 205 in the dielectric layer 113. The openings 205 may define shapes for second metal structures and may have dual damascene structures. A dual damascene structure may include holes 201 and trenches 203, wherein the holes 201 are at the bottoms of trenches 203. The openings 205 may be formed by the lithography and etching steps of a damascene or dual damascene process.

Figure 3:
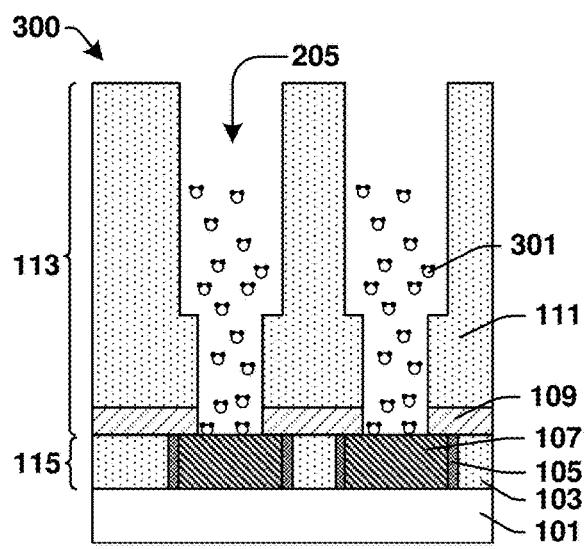

As illustrated by the cross-sectional view 300 of FIG. 3, the method continues with exposing the substrate 101 to a gas 301 that contacts the metal lines 107 through the openings 205 in the dielectric layer 113. The gas 301 is illustrated as comprising water ($H_2O$) but may include a plurality of reagents such as a mixture of hydrogen ($H_2$) and oxygen ($O_2$). Exposing the substrate 101 to the gas 301 may comprise placing the substrate in a chamber, heating the substrate within the chamber, and flowing components of the gas 301 through the chamber. In some embodiments, the gas 301 is maintained at partial pressures in the range from 100 torr to 5000 torr. In some embodiments, the chamber pressurized. Pressurizing the chamber may increase the process rate. In some embodiments, the gas 301 is maintained at partial pressures in the range from 300 torr to 1500 torr. In some embodiments, the substrate 101 is maintained at a temperature in the range from 50° C. to 200° C. In some embodiments, the substrate 101 is maintained at a temperature in the range from 75° C. to 150° C.

Figure 4:
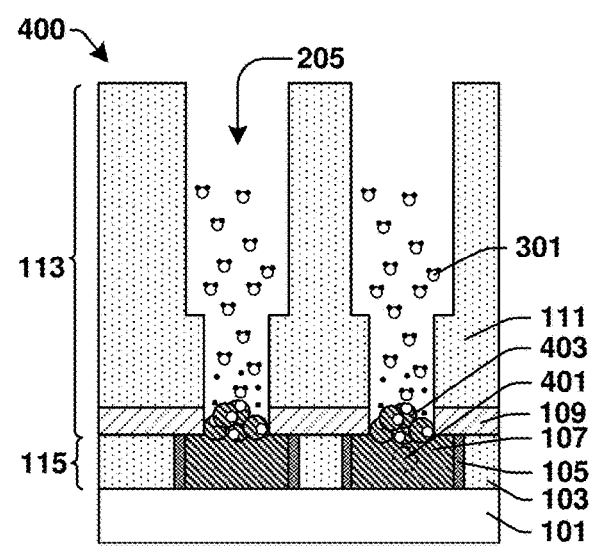

As illustrated by the cross-sectional view 400 of FIG. 4, the gas 301 reacts with metal material 401 from the metal lines 107 to form metal oxide 403. The metal oxide 403 has a lower density then the metal material 401. In some embodiments, the metal oxide 403 has a density 10% or more lower than a density of the metal material 401. In some embodiments, the metal oxide 403 has a density 20% or more lower than a density of the metal material 401. In some embodiments, the metal oxide 403 has a density about 30% or more lower than a density of the metal material 401. For example, copper (Cu) has a density of about 8.96 g/cm³, cuprous oxide ($Cu_2O$) has a density of about 6.0 g/cm³, and cupric oxide (CuO) has a density of about 6.32 g/cm³. Accordingly, as the metal material 401 undergoes oxidation it also undergoes an increase in volume that causes the metal material 401 to bulge into the openings 205.

Figure 5:
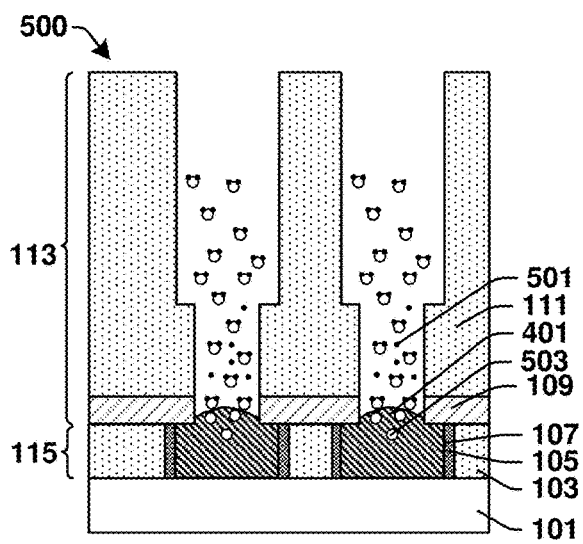

As illustrated by the cross-sectional view 500 of FIG. 5, a reaction takes place that reduces some of the metal oxide 403 that has bulged into the openings 205 back to the metal material 401. The reduction reaction may be with hydrogen ($H^+$) 501. The hydrogen may be derived by a component of the gas 301, such as molecular hydrogen ($H_2$), or from an oxidation reaction such as a reaction between water ($H_2O$) and copper (Cu) that produces hydrogen as a byproduct. Reduction may cause the metal material 401 to partially retract into the metal lines 107, but some remains within the openings 205. This may be due in part to some oxygen 503 having been taken up by the metal lines 107 causing them to expand but may also be due to a lack of driving force to return the reduced metal material 401 to the metal lines 107. Even if all the metal oxide 403 is reduced to metal material 401, some of the metal material 401 tends to remain within the openings 205.

Figure 6:
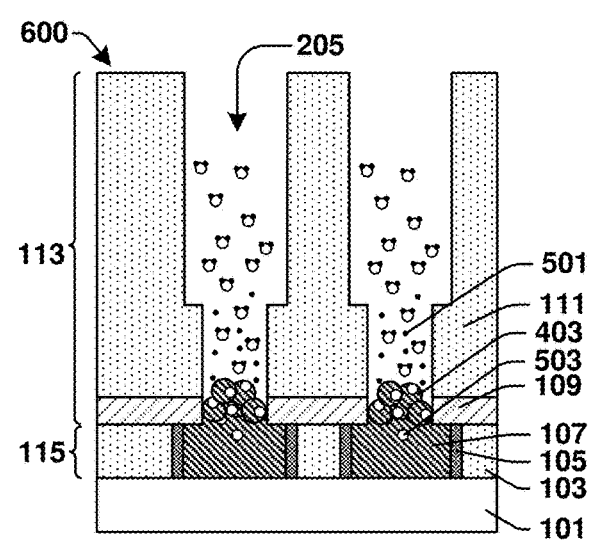
Figure 7:
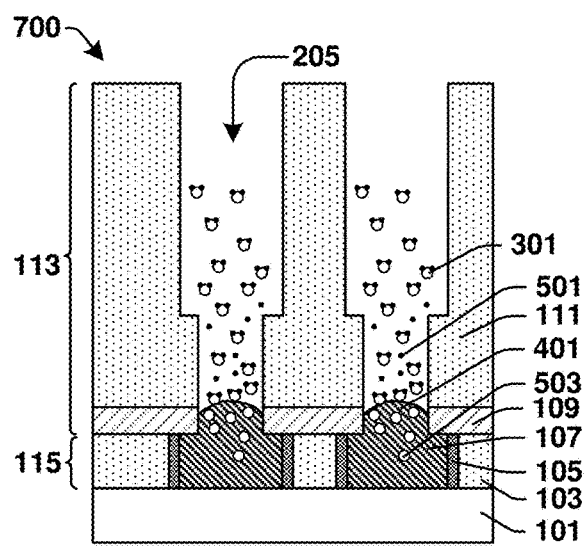
Figure 8:
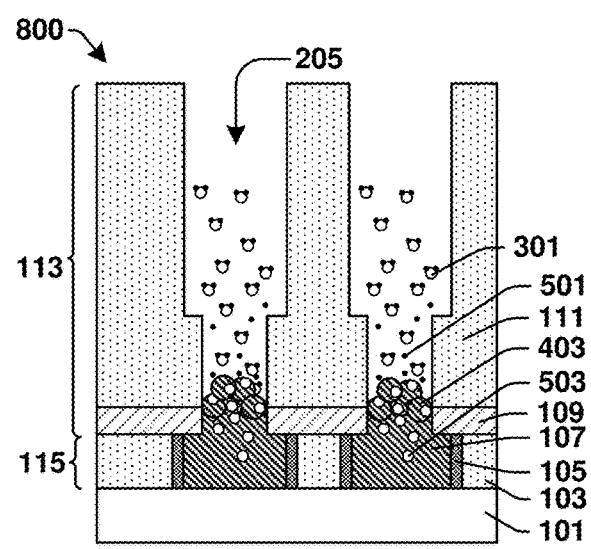

As illustrated by the cross-sectional view 600 of FIG. 6, the cross-sectional view 700 of FIG. 7, and the cross-sectional view 800 of FIG. 8, oxidation and reduction reactions continue in a cyclical fashion. The net effect is that the metal material 401 migrates from the metal lines 107 into the openings 205 in a diffusion-like manner. The oxidation and reducing reactions have been illustrated as occurring alternately and it is possible to alternate oxidizing and reducing reagents, however, in some embodiments the oxidizing and diffusing reagents are both continuously present. In these embodiments, the absolute rates of oxidation and reduction approach nearly a steady state. In the example illustrated by the series of cross-sectional views 300-800 of FIGS. 3-8, hydrogen 501 reaches a concentration such that a rate of reduction by reaction between hydrogen 501 and the metal oxide 403 approximately equals a rate of oxidation by reaction of water with the metal material 401. In some embodiments, a rate of reduction is maintained that is within 10% of a rate of oxidation. In some embodiments, a rate of reduction is maintained that is within 1% of a rate of oxidation. In some embodiments, a rate of reduction is maintained that is within 0.1% of a rate of oxidation.

As illustrated by the cross-sectional views 500-800 of FIGS. 5-8, some oxygen 503 may remain in the metal lines 107 and in the metal material 401 that has migrated into the openings 205. The oxygen 503 may penetrate progressively deeper into the metal lines 107 through solid diffusion. Progressively more oxygen is also added to the metal material 401 within the openings 205. As a result of these processes, an oxygen concentration profile develops whereby the oxygen concentration is highest adjacent the newly formed surface and decreases gradual downward through the openings 205 and outward from the openings 205 into the metal lines 107.

Figure 9:
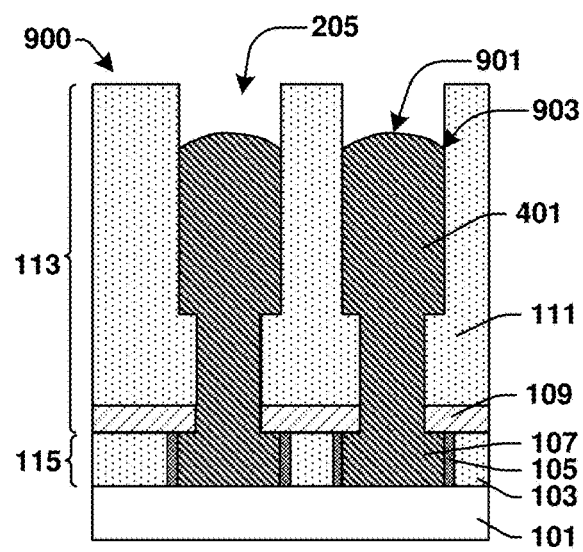

The process may continue until the openings 205 are filled to an extent illustrated by the cross-sectional view 900 of FIG. 9. In accordance with some embodiments, the process may terminate before the metal material 401 has completely filled the openings 205. In this embodiment, little or none of the metal material 401 migrates outside the openings 205. An advantage of this approach is that the spread of the metal material 401 to undesired locations outside the openings 205 may be kept to a minimum.

As further illustrated by the cross-sectional view 900 of FIG. 9, although the process causes the metal material 401 to fill the openings 205 from the bottom up, there is some non-uniformity in the upper surface of the metal material 401. In particular, the metal material 401 tends to bulge in the middles of the openings 205, whereby a height of the metal material 401 tends to have a maximum proximate the centers 901 and a minimum proximate the edges 903. The bulging toward the middle is the result of edge effects, whereby a growth rate adjacent the sides of openings 205 tends to be lower than a growth rate near the centers of the openings 205.

Figure 10:
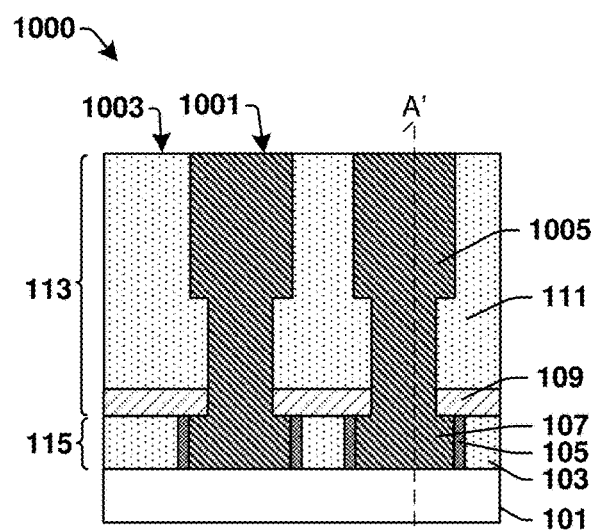

As illustrated by the cross-sectional view 1000 of FIG. 10, a planarization process such as chemical mechanical polishing (CMP) may be carried out to flatten an upper surface 1001 of the metal material 401 within the openings 205. The CMP may lower an upper surface 1003 of the interlevel dielectric layer 111 to a height below the minimum height of the metal material 401 at the edges 903 shown by the cross-sectional view 900 of FIG. 9. The remaining metal material 401 may completely fill a remaining portion of the openings 205. The remaining metal material 401 provides second metal structures 1005 over the metal lines 107. The second metal structures 1005 may form a metallization layer.

Figure 11A:
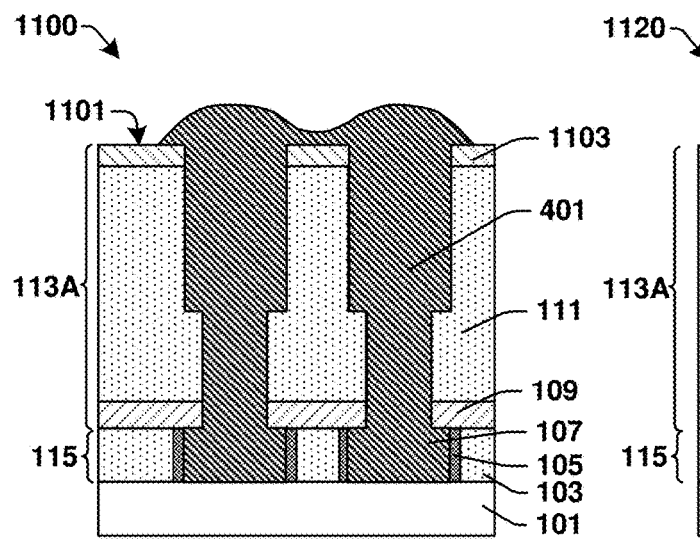
FIGS. 11A-11B are a series of cross-sectional view illustrations exemplifying a variation of the method of FIGS. 1-10 according to some other embodiments of the present teachings.
Figure 11B:
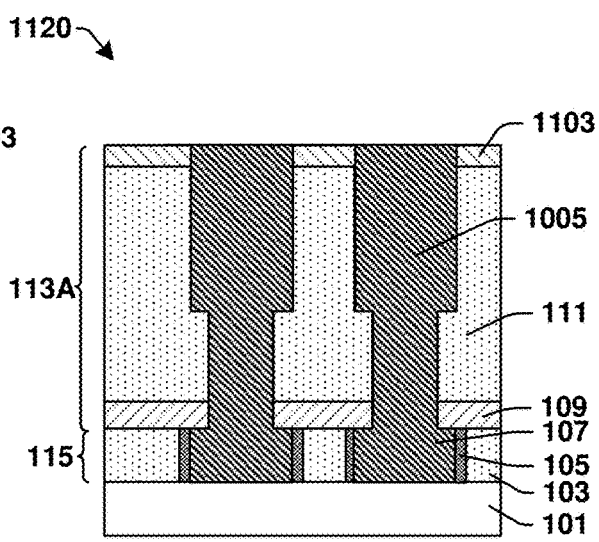

FIGS. 11A and 11B are cross-sectional views exemplifying an alternate method that is a variation on the method illustrated by FIGS. 1 through 10. As illustrated by the cross-sectional view 1100 of FIG. 11A, which may be compared to the cross-sectional view 900 of FIG. 9, in the alternate method the process of inducing metal migration continues until the metal material 401 has completely filled the openings 205 and begun to mound on the surface 1101. In some embodiments, the metal material 401 mounds on the surface 1101 until the metal material 401 from adjacent openings 205 has begun to merge. In some embodiments, the alternate method is characterized by there being a stop layer 1103 at the top of the dielectric 113A. The stop layer 1103 may be an etch stop layer or a CMP stop layer. The stop layer 1103 may be, for example, a nitride (e.g., silicon oxy-nitride, silicon nitride, etc.), a carbide (e.g., silicon carbide, silicon oxy-carbide etc.), a metal-oxide (e.g., aluminum-oxide, hafnium-oxide, etc.), or the like.

As illustrated by the cross-sectional view 1120 of FIG. 11B, the alternate method continues with a planarization process such as CMP. The planarization may stop on the stop layer 1103. The stop layer 1103 may prevent metal material 401 from contaminating the interlevel dielectric layer 111 during the CMP process.

FIGS. 12A through 12D are a series of cross-sectional views exemplifying a further variation on the method illustrated by FIGS. 1 through 10. As illustrated by the cross-sectional view 1200 of FIG. 12A, a high aspect ratio opening 1201 in a dielectric layer 113B may be partially filled with metal material 401 by inducing the metal material 401 to migrate from the metal lines 107 as illustrated by the series of cross-sectional views 300-900 of FIGS. 3-9. In some embodiments, the opening 1201 has a lower portion 1205 that is hole or via and an upper portion 1203 that is wider and may be a hole or a trench. In some embodiments, metal material 401 fills the lower portion 1205.

Figure 12A:
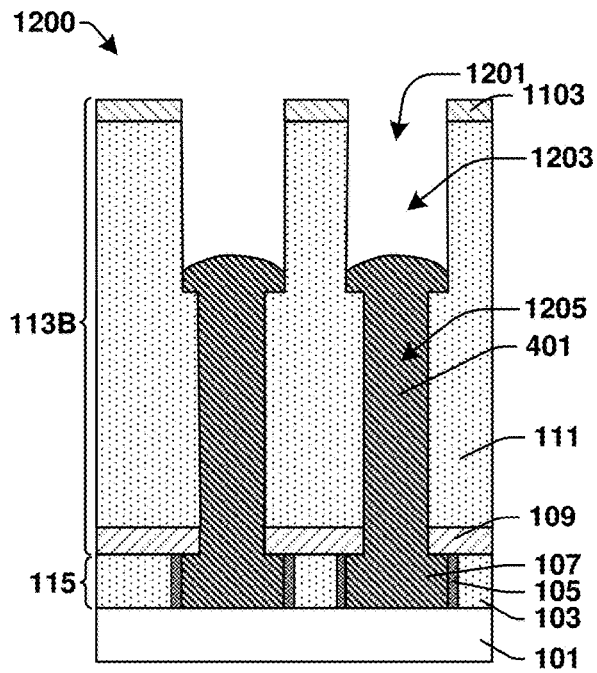
FIGS. 12A-12D are a series of cross-sectional view illustrations exemplifying another variation of the method of FIGS. 1-10 according to some further embodiments of the present teachings.
Figure 12B:
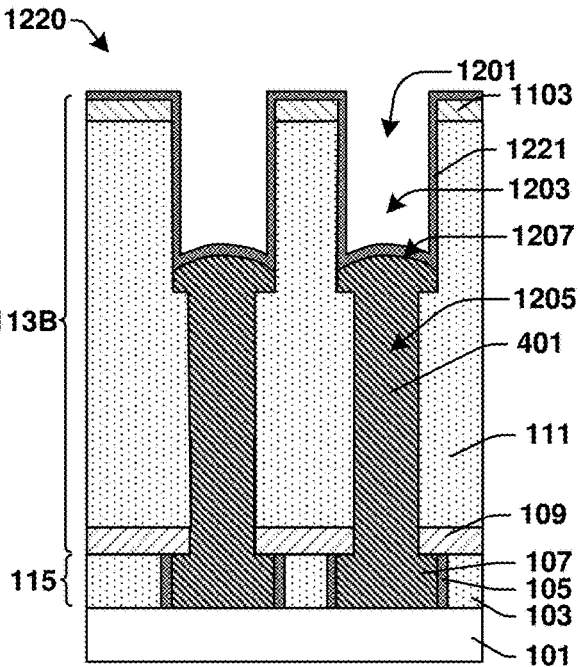

As shown by the cross-sectional view 1220 of FIG. 12B, a diffusion barrier layer 1221 may be deposited to line an unfilled portion of the opening 1201. The diffusion barrier layer 1221 may be, for example a compound of a transition metal such as tantalum nitride, titanium nitride, tungsten nitride, or the like. The metal material 401 may be left with a convex upper surface 1207 due to the growth pattern of the metal material 401. The diffusion barrier layer 1221 may have a concave lower surface that conform to the convex upper surface 1207.

Figure 12C:
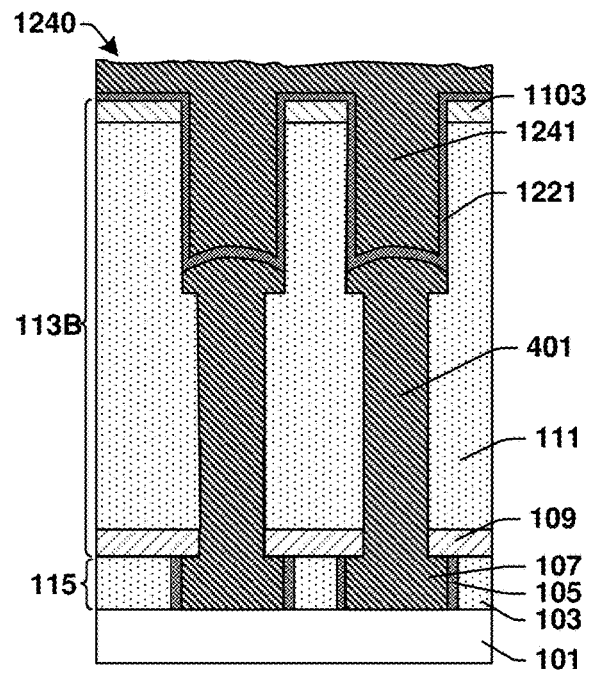
Figure 12D:
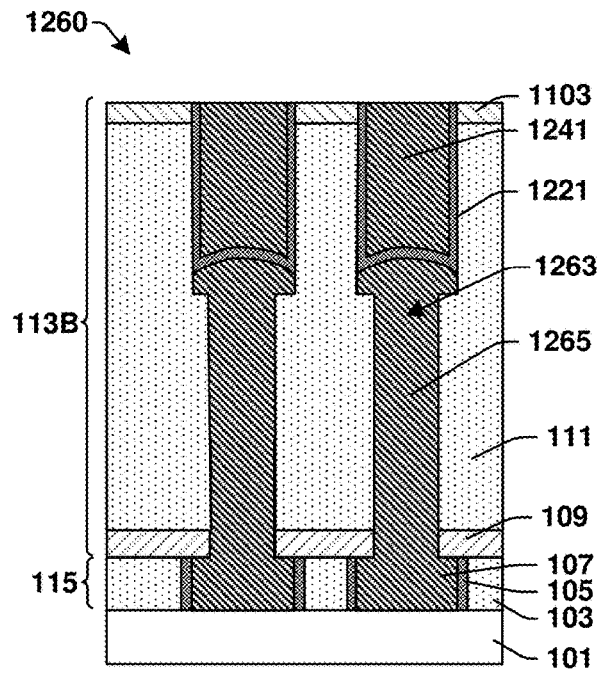

As shown by the cross-sectional view 1240 of FIG. 12C, a remaining portion of the opening 1201 may be filled with a metal deposition process to form an upper metal structure 1241. The metal deposition process may be physical vapor deposition (PVD), chemical vapor deposition (CVD), atomic layer deposition (ALD), plating (electrolytic or electroless), or a combination thereof. For example, a copper seed layer may be deposited by PVD followed by copper plating. As shown by the cross-sectional view 1260 of FIG. 12D, excess metal that deposits outside the opening 1201 may be removed by a planarization process such as CMP.

The planarization process forms a composite second metal structure 1263 that includes a lower metal structure 1265 that is formed from the metal material 401 and the upper metal structure 1241 that is formed from deposited metal. In some embodiments, the lower metal structure 1265 and the upper metal structure 1241 are separated by the diffusion barrier layer 1221. In some embodiments, one continuous interlevel dielectric layer 111 is lateral to both the lower metal structure 1265 and the upper metal structure 1241 are within one interlevel dielectric layer 113B. In some embodiments, one continuous interlevel dielectric layer 111 is lateral to both the lower metal structure 1265 and the upper metal structure 1241. In some embodiments, only the upper metal structure 1241 is separated from the interlevel dielectric layer 111 by the diffusion barrier layer 1221.

Figure 13:
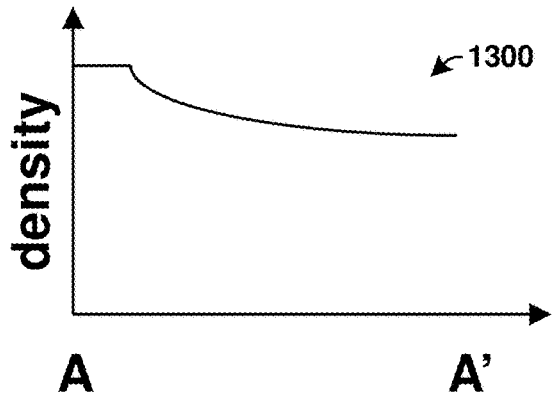
FIG. 13 is a plot illustrating a density variation in a device manufactured according to some embodiments of the present disclosure.

FIG. 13 provides a plot 1300 showing a variation in density that may occur along the line A-A' shown in FIG. 10. The plot 1300 shows the density being higher in the metal lines 107 and at the base of second metal structure 1005 in comparison to points higher in the second metal structure 1005 such as a point at a middle height of the second metal structure 1005. The density decreases steadily with height throughout the second metal structure 1005. This density variation correlates with an oxygen concentration variation. A gradient in the density may be highest near the base of the second metal structure 1005.

Figure 14:
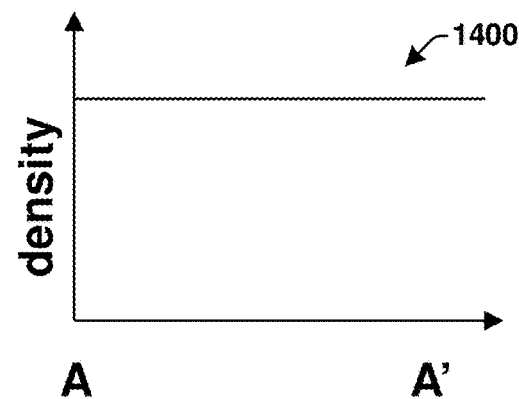
FIG. 14 is a plot illustrating a density variation in a device manufactured according to some embodiments of the present disclosure after annealing.

FIG. 14 provides a plot 1400 showing the variation in density along the line A-A' as it may look after an optional step of annealing. As shown by this illustration, annealing may be used to reduce or eliminate the density gradients through the second metal structures 1005. Annealing may also reduce the amount of oxygen in the second metal structure 1005 and increase its conductivity. A temperature that approaches a reflow temperature of the metal material 401 is generally suitable for annealing. In some embodiments, annealing takes place at a temperature in the range from about 350° C. to about 450° C. in an atmosphere that contains little or no oxygen.

Figure 15:
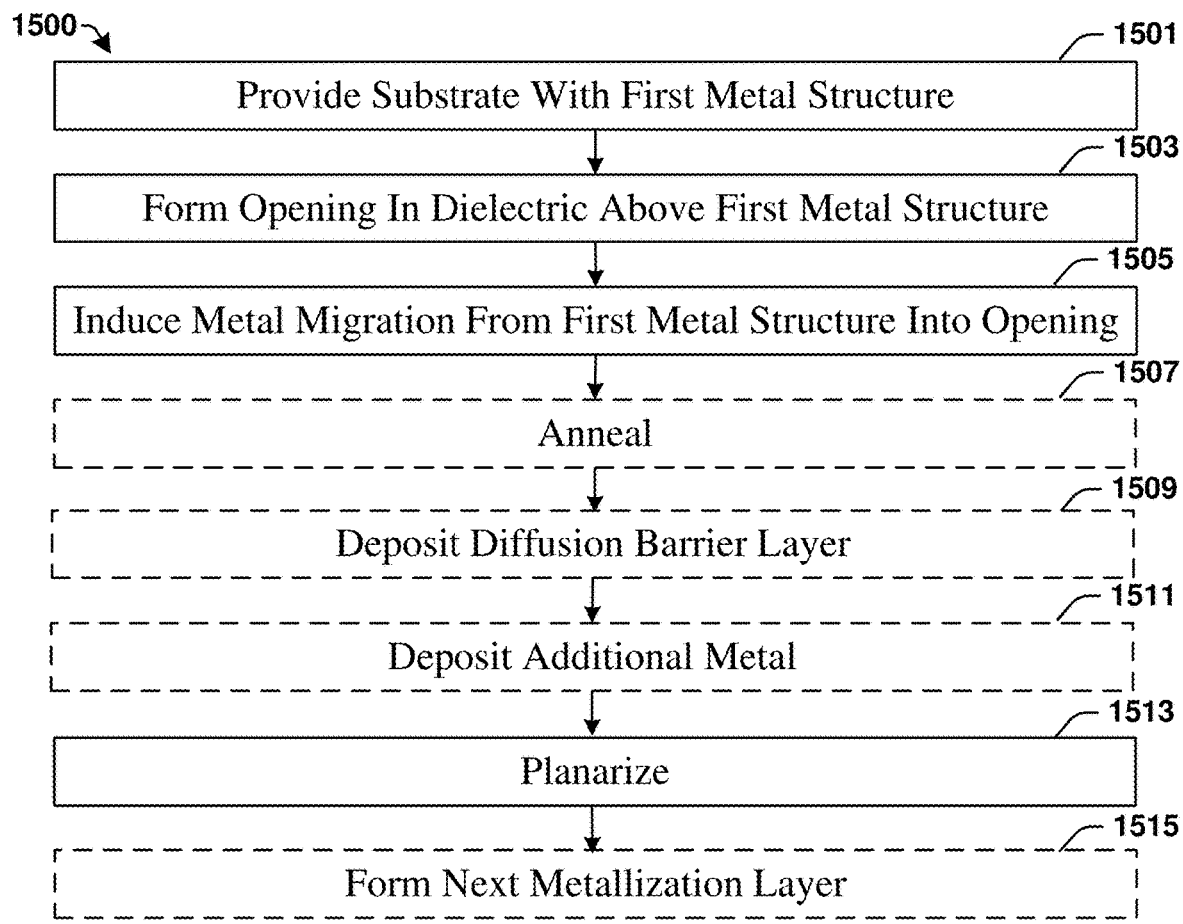
FIG. 15 is a flow chart of a method according to some aspects of the present teachings.

FIG. 15 is a flow chart of a method 1500 according to some aspects of the present teachings. While the method 1500 of FIG. 15 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts are required to implement one or more aspects or embodiments of the description herein, and one or more of the acts depicted herein may be carried out in one or more separate acts and/or phases.

The method 1500 begins with act 1501, receiving a substrate having a first metal structure. FIG. 1 provides an example. The first metal structure may be a metal line within a metallization layer.

The method 1500 continues with act 1503, forming a dielectric structure with an opening that exposes the first metal structure. FIG. 2 provides an example. The dielectric structure may be formed over the first metal structure and may comprise a plurality of dielectric layers. In some embodiments, the opening in the dielectric structure has the shape of a dual damascene structure.

The method 1500 continues with act 1505, inducing metal material to migrate from the first metal structure into the opening. The series of cross-sectional views 300-900 of FIGS. 3 to 9 provide an example. In some embodiments, inducing the metal material to migrate comprises introducing one or more gases that alternately oxidize and reduce the metal material. Act 1505 may result in partial filling of the opening with metal material, as illustrated by the cross-sectional view 900 of FIG. 9 and the cross-sectional view 1200 of FIG. 12A, or complete filling of the opening with metal, as illustrated by the cross-sectional view 1100 of FIG. 11A.

Any suitable gas or combination of gases may be used to induce oxidation and reduction reactions that result in metal migration. In some embodiments, the gas mixture comprises hydrogen ($H_2$) and an oxygen source. In some embodiments, the oxygen source is oxygen (O2), carbon monoxide (CO), carbon dioxide ($CO_2$), nitrous oxide ($N_2O$), nitric oxide (NO), dinitrogen oxide ($N_2O_2$), nitrogen dioxide ($NO_2$), a combination thereof, or the like. In some embodiments, the gas mixture comprises hydrogen ($H_2$) and oxygen ($O_2$). Using hydrogen is advantageous in that hydrogen has a very high diffusion rate. In some embodiments, all or part of the hydrogen is replaced by water ($H_2O$). Replacing hydrogen with water as a reagent for reduction may provide greater safety. Water can also provide some or all of the oxidizing reagent.

The method 1500 may optionally continue with act 1507, annealing the metal material to ameliorate a density gradient in the second metal structure. The is illustrated by the plots 1300 and 1400 of FIGS. 13 and 14. In some embodiments, annealing takes place before act 1513, planarization. Carrying out annealing prior to planarization may be advantageous in the event that annealing causes some shrinkage in the metal material.

In some embodiments, the method 1500 includes act 1511, depositing additional metal to complete filling of the opening, or act 1509 and act 1511, depositing a diffusion barrier layer and then depositing additional metal. The cross-sectional view 1220 of FIG. 12B provides an example in which a diffusion barrier layer is formed and the cross-sectional view 1240 of FIG. 12C provides an example in which metal is deposited to complete filling of the opening.

Act 1513 is planarization, which my comprise CMP. The cross-sectional view 1000 of FIG. 10, cross-sectional view 1120 of FIG. 11B, and the cross-sectional view 1260 of FIG. 12D each provide an example.

After planarization, the method 1500 may optionally continue with act 1515, forming another metallization layer over one provided by the second metal structure and having connections to the second metal structure. This overlying metallization layer may form connections to the second metal structure and may be formed by a conventional method, such as PVD, CVD, ALD, plating, or a combination thereof. The overlying metallization layer may have a same composition as the underlying metallization layer that provides the first metal structure.

Figure 16:
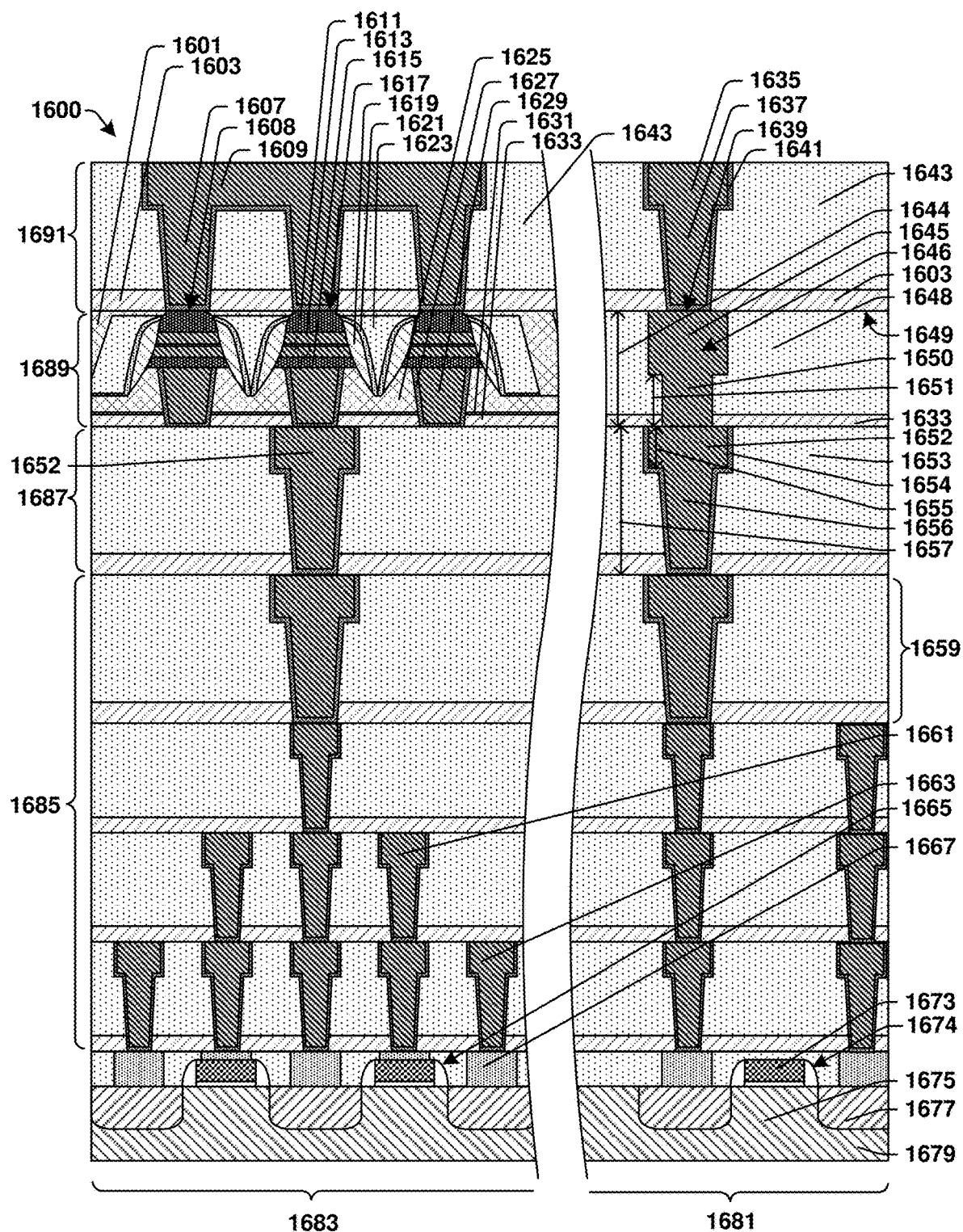
FIG. 16 is a cross-sectional view illustration of a device according to some aspects of the present teachings.

FIG. 16 illustrates an integrated device 1600 that includes a second metal structure 1646 that provides an intermediate metallization layer 1689 and is coupled to both an underlying metallization layer 1687 and to an overlying metallization layer 1691. The integrated device 1600 has a substrate 1679 that includes an embedded memory region 1683 and a logic region 1681. The intermediate metallization layer 1689 is in the logic region 1681 and is at a same height over the substrate 1679 as memory cells 1617 in an array within the embedded memory region 1683.

The memory cells 1617 comprise a data storage structure such as a magnetic tunnel junction (MTJ) 1613 sandwiched between a bottom electrode 1615 and a top electrode 1611. The memory cells 1617 are surrounded by dielectrics such as first sidewall spacers 1619, a passivation layer 1621, second sidewall spacers 1623, and a memory interlevel dielectric layer 1601. The second metal structure 1646 is surrounded by a logic interlevel dielectric layer 1648. In some embodiments, upper surfaces 1608 of the top electrodes 1611 are vertically aligned with upper surfaces 1639 of the second metal structure 1646. In some embodiments, an etch stop layer 1603 extends from the embedded memory region 1683 to the logic region 1681 and has a lower surface 1649 that vertically aligns with the upper surfaces 1608 of the top electrodes 1611 and the upper surface 1639 of the second metal structure 1646.

The second metal structure 1646 may include an upper portion 1645 that may be in the form of a line or a via and a lower portion that is a via portion 1650. A top via 1637 may connect the upper portion 1645 to a metal line 1635 in the overlying metallization layer 1691. Similar top vias 1607 may connect the memory cells 1617 to a bit line (BL) 1609 or other structure in the overlying metallization layer 1691. The via portion 1650 connects with a metal line 1652 in the underlying metallization layer 1687.

The memory cells 1617 are connected to other metal lines 1652 or vias in the underlying metallization layer 1687 through bottom electrode vias 1629. The bottom electrode vias 1629 may pass through various dielectric layers such as a first etch stop layer 1633, a second etch stop layer 1631, and an insulating layer 1625. The bottom electrode vias 1629 may be separated from these dielectric layers by a barrier layer 1627. The first etch stop layer 1633 may extend into the logic region 1681.

Within the intermediate metallization layer 1689, the second metal structure 1646 directly abuts the logic interlevel dielectric layer 1648. By contrast, the metal lines 1635 and top vias 1637 of the overlying metallization layer 1691 and the metal lines 1652 and vias 1656 of the underlying metallization layer 1687 are separated from interlevel dielectric 1643 and interlevel dielectric 1653 by diffusion barrier layer 1641 and diffusion barrier layer 1654 respectively. The diffusion barrier layer 1641 extends between a top via 1637 and the second metal structure 1646. The diffusion barrier layer 1654 extends between the vias 1656 and the lower metal interconnect structure 1659. By contrast, the second metal structure 1646 directly contacts the metal lines 1652.

A metal interconnect structure 1685 comprising a plurality of metallization layers may be disposed between the lower metallization layer 1687 and the substrate 1679. Transistors 1665 may be formed in the substrate 1679 within the embedded memory region 1683 and transistors 1674 may be formed within the substrate 1679 within the logic region 1681. In some embodiments, these are HKMG transistors. In some embodiments, the substrate 1679 comprises a semiconductor body, e.g., silicon, SiGe, silicon-on-insulator (SOI), or the like. The substrate 1679 may be a semiconductor wafer, one or more dies on a wafer, or any other type of semiconductor body and/or epitaxial layers associated therewith. The transistors 1674 and the transistors 1665 comprise gates 1673 and source/drain regions 1677. Source/drain regions 1677 may be formed in the substrate 1679 and have opposite doping type from channel regions 1675. Any of the gates 1673 or the source/drain regions 1677 may be coupled using contact plugs 1667 to the metal interconnect structure 1685. The metal interconnect structure 1685 may provide common source lines (CSLs) 1663, word lines (WLs) 1661, and related connections for addressing the memory cells 1617. Connections are shown for only one of the memory cells 1617. The transistors 1665 provide access control devices for the memory cells 1617 but other access control devices may be used instead.

Figure 17:
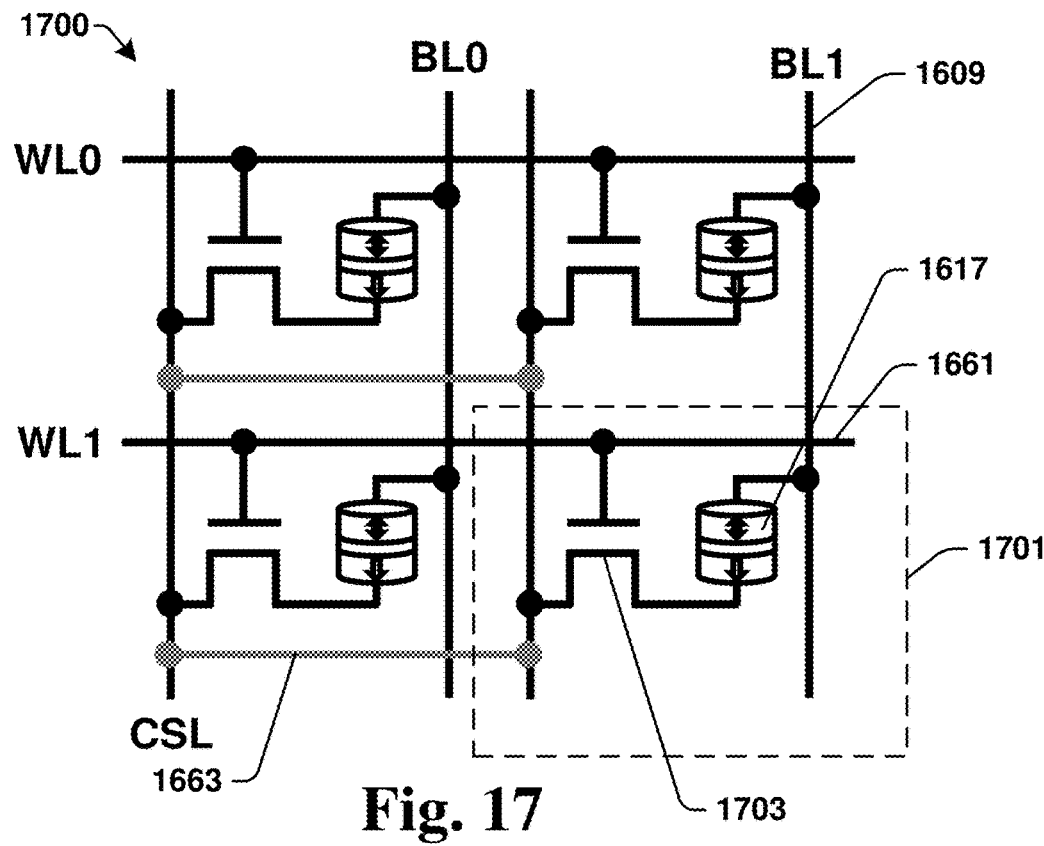
FIG. 17 is an equivalent circuit diagram for the device of FIG. 16.

FIG. 17 provides an equivalent circuit diagram 1700 for the embedded memory region 1683 of the integrated device 1600. Word line WL0 and word line WL1 may be used as row selectors and bit line BL0 and bit line BL1 may be used as column selectors for an array of memory cells 1617. A common source line (CSL) may provide voltages for read, write, and erase operations. Transistors 1703 may be operated to select which memory cells 1617 are coupled to a corresponding word line WL0 or WL1. Some of these equivalent circuit devices may be duplicated in the physical implementation of this equivalent circuit to meet specifications and satisfy design rules. For example, as shown by the portion of the memory region 1683 illustrated in FIG. 16, which implements a block 1701 of the equivalent circuit diagram 1700, there may be two word lines 1661 for each word line WL1 and two transistors 1665 for each of the transistors 1703.

In a typical metal interconnect structure, a plurality of metallization layers are stacked over a substrate with the higher metallization layers being thicker and have greater line widths than lower metallization layers. By contrast, in some embodiments a height 1644 of the intermediate metallization layer 1689 is less than a height 1657 of the underlying metallization layer 1687. In some embodiments the height 1644 half or less the height 1657. In some embodiments, the height 1657 is less than a height 1655 of the metal lines 1652.

Figure 18:
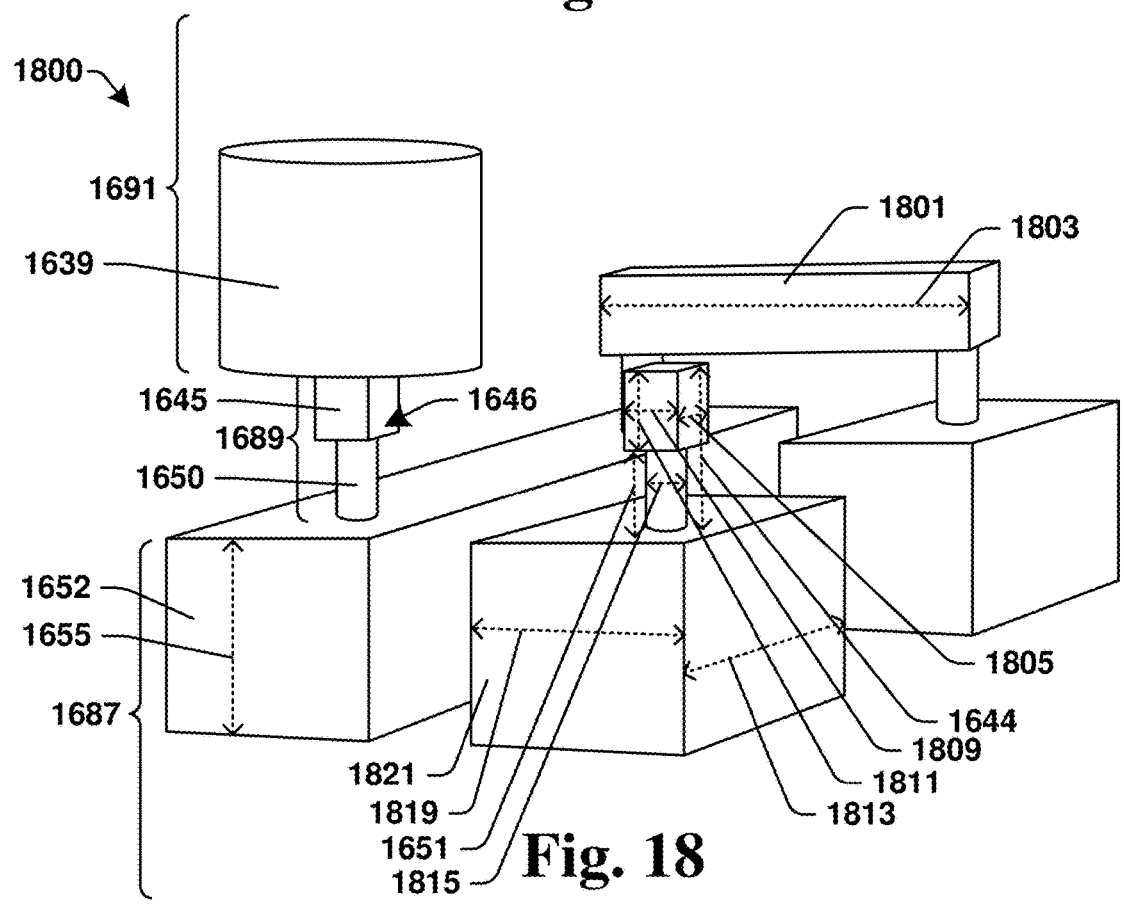
FIG. 18 is a sketch illustrating metal structures formed according to some aspects of the present teachings.

FIG. 18 is a sketch 1800 giving a sense of scale and relationship between the metal lines 1652 and the second metal structure 1646. As shown in the sketch 1800 of FIG. 18, the metal lines 1652 may be in the form of metal islands 1821. The metal islands 1821 are larger than the second metal structure 1646. In some embodiments, the second metal structure 1646 has a volume that is from 0.1% to 50% a volume of an adjoining metal island 1821. In some embodiments, the volume of the second metal structure 1646 is one fourth or less the volume of the metal island 1821. In some embodiments, a volume of the second metal structure 1646 is one tenth or less a volume of the metal island 1821. In some embodiments, a volume of the second metal structure 1646 is one twentieth or less a volume of the metal islands 1821.

In some embodiments, the metal islands 1821 are extended to provide more source material for the second metal structures 1646. In some embodiments, the metal islands 1821 have a ratio of width 1819 to length 1813 in the range from 2:3 to 1:20. In some embodiments, the ratio is in the range from 1:2 to 1:10. In some embodiments, the ratio is in the range from 1:3 to 1:7, e.g., 1:5. There may be only one second metal structure 1646 or only one via portion 1651 for each of the metal islands 1821.

In some embodiments, a cross-sectional area of the second metal structure 1646 is one fourth or less a cross-sectional area of an adjoining metal island 1821. In some embodiments, a cross-sectional area of the second metal structure 1646 is one tenth or less a cross-sectional area of an adjoining metal island 1821. In some embodiments, a width 1809 of the second metal structure 1646 is half or less a width of the metal islands 1821. In some embodiments, the width 1809 is one fourth or less a width of the metal islands 1821.

In some embodiments, the width 1819 of the metal islands 1821 and of the metal lines 1652 is in the range from 14 nm to 126 nm. In some embodiments, the width 1819 is in the range from 14 nm to 126 nm. In some embodiments, a width 1815 of the via portion 1650 is in the range from 10 nm to 65 nm. In some embodiments, the width 1815 is in the range from 14 nm to 30 nm. In some embodiments, a width 1805 of the upper portions 1645 is in the range from 10 nm to 126 nm. In some embodiments, the width 1805 is in the range from 10 nm to 50 nm.

The methods of the present disclosure are particularly advantageous for filling high aspect ratio openings 205 (see FIG. 2). Accordingly, the second metal structure 1646 may have a high aspect ratio. In some embodiments, the aspect ratio is 10:1 or greater. In some embodiments, the aspect ratio is 15:1 or greater. In some embodiments, the aspect ratio is 20:1 or greater. The aspect ratio may be based on the via portion 1650 (the height 1651 to the width 1815) or on the entire second metal structure 1646. In the latter case, the aspect ratio is between the height 1644 and either the width 1815 or the width 1809 as measured at a midpoint of the height 1644.

In some embodiments, the intermediate metallization layer 1689 includes a metal line 1801. In some embodiment, the metal line 1801 connects two metal islands 1821 or another pair of conductive structures in the lower metallization layer 1687. In some embodiments, a length 1803 of the metal line 1801 is no more than ten times a width 1819 of the metal line 1652. In some embodiments, the length 1803 is no more than five times the width 1819. In some embodiments, the length 1803 is no more than three times the width 1819.

In some embodiments, a height 1655 of the metal line 1652 is in the range from 32 nm to 3000 nm. In some embodiments, the height 1655 is in the range from 300 nm to 3000 nm. In some embodiments, the height 1655 is in the range from 32 nm to 260 nm. In some embodiments, a height 1651 of the via portion 1650 is half or less the height 1655 of the metal line 1652. In some embodiments, the height 1651 is one quarter or less the height 1655. In some embodiments, the height 1651 is one eighth or less the height 1655. In some embodiments, the height 1811 of the upper portion 1645 is greater than the height 1651 of the via portion. In some embodiments, the height 1811 twice or more the height 1651.

FIGS. 19 through 29 present a series of cross-sectional view illustrations exemplifying a method according to the present teachings of forming the second metal structure 1646 over the metal lines 1652 in the integrated device 1600 of FIG. 16. While FIGS. 19 through 29 are described with reference to various embodiments of a method, it will be appreciated that the structures shown in FIGS. 19 through 29 are not limited to the method but rather may stand alone separate from the method. FIGS. 19 through 29 are described as a series of acts, it will be appreciated that the order of the acts may be altered in other embodiments. While FIGS. 19 through 29 illustrate and describe a specific set of acts, some acts that are illustrated and/or described may be omitted in other embodiments. Further, acts that are not illustrated and/or described may be included in other embodiments.

Figure 19:
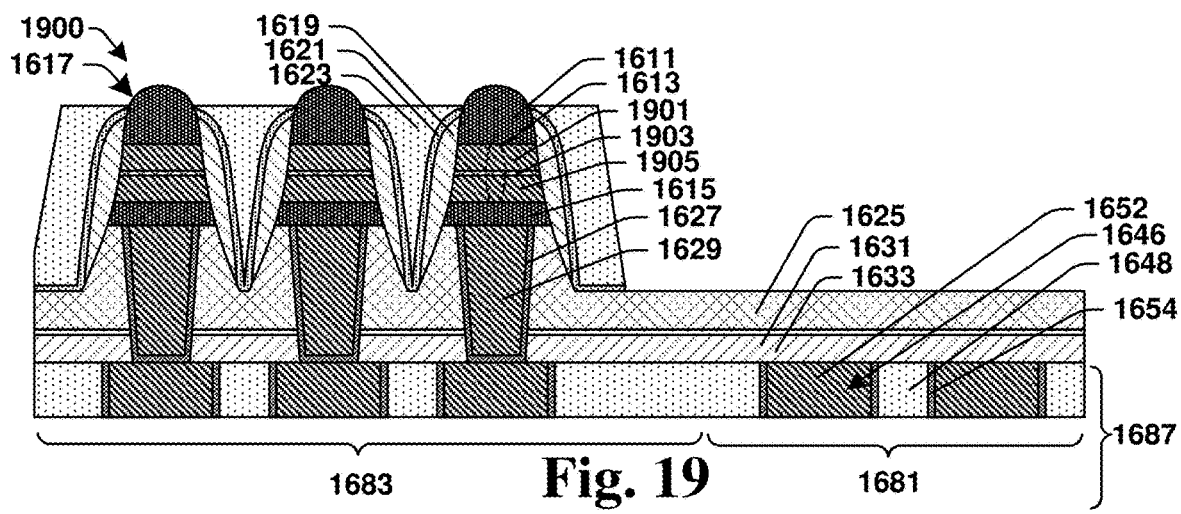
FIGS. 19-27 are a series of cross-sectional view illustrations exemplifying a method of forming a device according to some embodiments the present teachings.

The cross-sectional view 1900 of FIG. 19 shows the array of memory cells 1617 having been formed over the metallization layer 1687. The data storage structure of the memory cells 1617 is illustrated as an MTJ 1613, but the data storage structure may be that of resistive random access memory (RRAM), oxygen displacement memory (OxRAM), conductive bridging random access memory (CBRAM), magnetoresistive random access memory (MRAM), ferroelectric random access memory (FRAM), phase-change memory (PCM), carbon nanotube random access memory (ARAM), the like, or any other type of memory.

The MTJ 1613 may include a lower magnetic layer 1905 and an upper magnetic layer 1901 separated by a tunnel barrier layer 1903. The lower magnetic layer 1905 and the upper magnetic layer 1901 may be ferromagnetic materials such as cobalt-iron-boron (CoFeB), cobalt-iron (CoFe), and nickel-iron (NiFe), cobalt (Co), iron (Fe), nickel (Ni), iron-boron (FeB), iron-platinum (FePt), or the like. The tunnel barrier layer may be a metal oxide such as magnesium oxide (MgO), aluminum oxide ($Al_2O_3$), or the like.

The dielectrics surrounding the memory cells 1617 include the first sidewall spacers 1619, the passivation layer 1621, and the second sidewall spacers 1623, but may include fewer or other dielectric layers. The first sidewall spacers 1619 may be, for example, a nitride (e.g., silicon oxy-nitride, silicon nitride, etc.), a carbide (e.g., silicon carbide, silicon oxy-carbide etc.), or the like. The passivation layer 1621 may be, for example, a metal-oxide (e.g., aluminum-oxide, hafnium-oxide, etc.), or the like. The second sidewall spacers 1623 may be, for example, an oxide (e.g., silicon dioxide ($SiO_2$), etc.).

The bottom electrodes 1615 are connected to upper portions 1645 by bottom electrode vias 1629. The bottom electrode 1615, the top electrode 1611, and the bottom electrode vias 1629 may be, for example, titanium (Ti), tantalum (Ta), titanium nitride (TiN), tantalum nitride (TaN), platinum (Pt), gold (Au), iridium (Ir), tungsten (W), nickel (Ni), ruthenium (Ru), copper (Cu), tungsten silicide (WSi), combinations thereof, or the like. The bottom electrode vias 1629 pass through dielectric layer including the first etch stop layer 1633, the second etch stop layer 1631, and the insulating layer 1625, although a greater or fewer number of dielectric layers may be used. At this stage of processing, all of these layers may extend into the logic region 1681. The first etch stop layer 1633 may be, for example, a nitride (e.g., silicon oxy-nitride, silicon nitride, etc.), a carbide (e.g., silicon carbide, silicon oxy-carbide etc.), or the like. The second etch stop layer 1631 may be, for example, a nitride (e.g., silicon oxy-nitride, silicon nitride, etc.), a carbide (e.g., silicon carbide, silicon oxy-carbide etc.), a metal-oxide (e.g., aluminum-oxide, hafnium-oxide, etc.), or the like. The insulating layer 1625 may be an oxide (e.g., silicon dioxide ($SiO_2$), etc.), a low-k dielectric, or an extremely low-k dielectric. The barrier layer 1627 that separates the bottom electrode vias 1629 from the dielectrics may be, for example, tantalum nitride, titanium nitride, or the like.

The metal lines 1652 may have any suitable composition that provides a metal material for forming the second metal structure 1646 according to a method of the present disclosure. The metal material may be copper (Cu), silver (Ag), or another metal that is a good conductor, may be oxidized without too much difficulty, and undergoes a reduction in density upon oxidation. The logic interlevel dielectric layer 1648 may be an oxide (e.g., silicon dioxide ($SiO_2$), etc.), a low-k dielectric, or an extremely low-k dielectric. The diffusion barrier layers 1654 that separates the logic interlevel dielectric layer 1648 from the upper portions 1645 may be, for example, tantalum nitride, titanium nitride, or the like.

Figure 20:
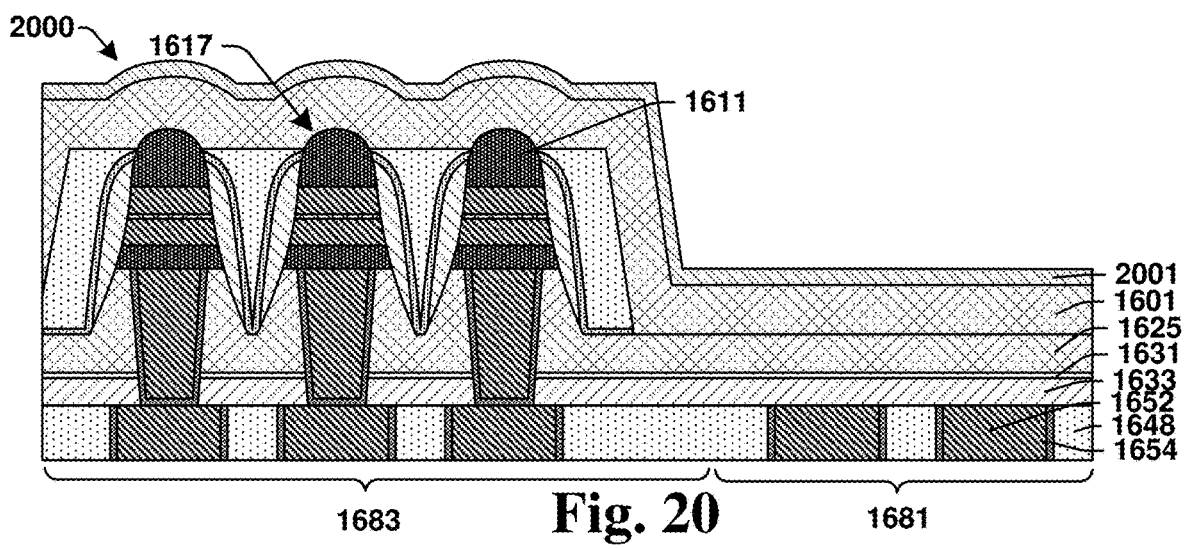

As shown by the cross-sectional view 2000 of FIG. 20, the memory interlevel dielectric layer 1601 and a nitrogen-free anti-reflective layer (NFARL) 2001 may be formed over the structure illustrated by the cross-sectional view 1900 of FIG. 19. The memory interlevel dielectric layer 1601 may be, for example, an oxide layer formed from tetra ethyl ortho silicate (TEOS), a low-k dielectric layer, or an extremely low-k dielectric layer. The NFARL 2001 may be, for example silicon-rich oxide (SRO), silicon oxycarbide, or the like. These layers may be formed, for example, by CVD, PECVD, ALD, or the like.

Figure 21:
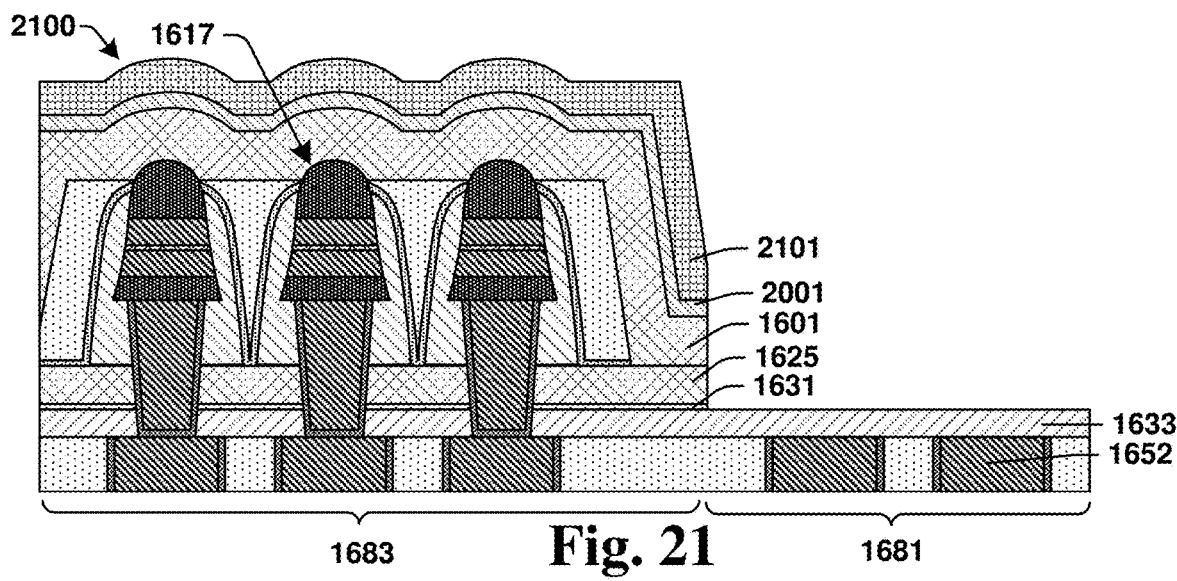

As shown by the cross-sectional view 2100 of FIG. 21, a mask 2101 may be formed over the structure shown by the cross-sectional view 2000 of FIG. 20, patterned using photolithography, and used to etch the NFARL 2001, the memory interlevel dielectric layer 1601, the insulating layer 1625, and the second etch stop layer 1631 from the logic region 1681. The etch may be a plasma etch that stops on the first etch stop layer 1633. After etching, the mask 2101 may be stripped.

Figure 22:
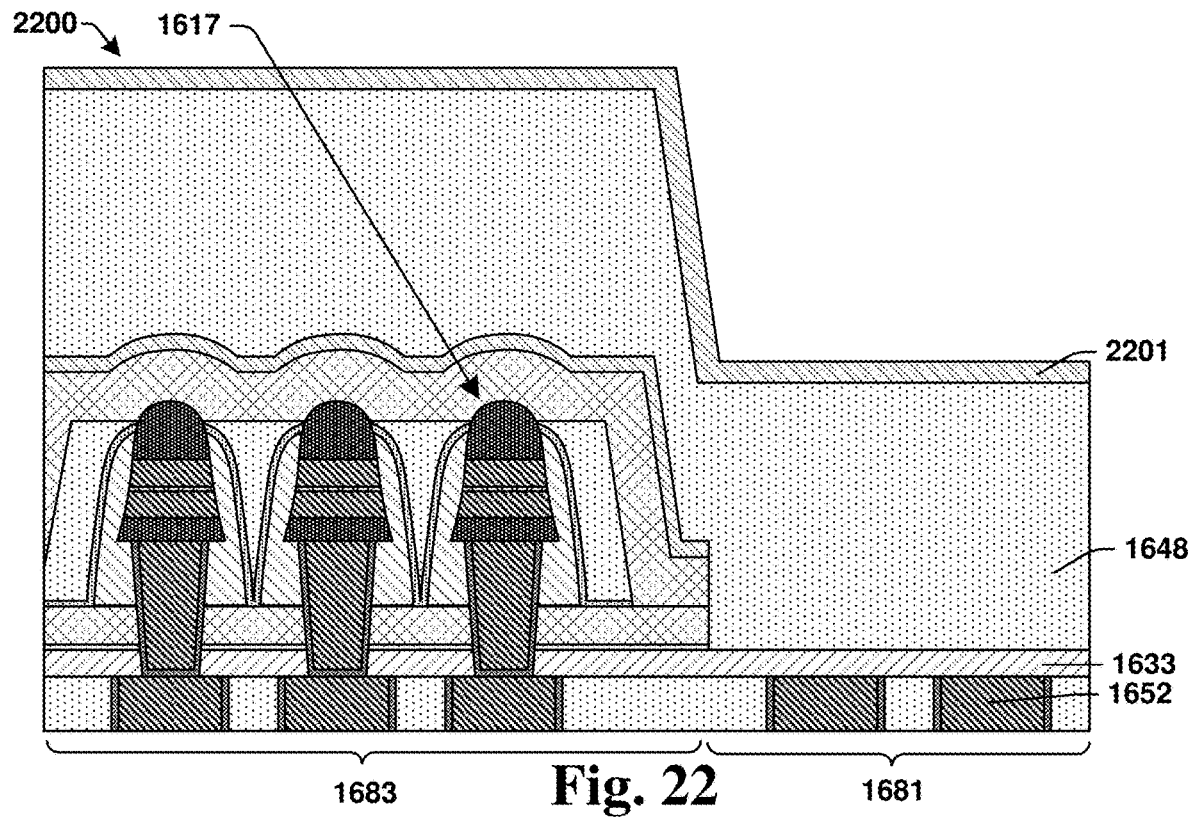

As shown by the cross-sectional view 2200 of FIG. 22, the logic interlevel dielectric layer 1648 may be deposited followed by an NFARL 2201. The logic interlevel dielectric layer 1648 may be deposited to a height greater than that of the memory cells 1617. These layers may be deposited by CVD, PECVD, ALD, or the like.

Figure 23:
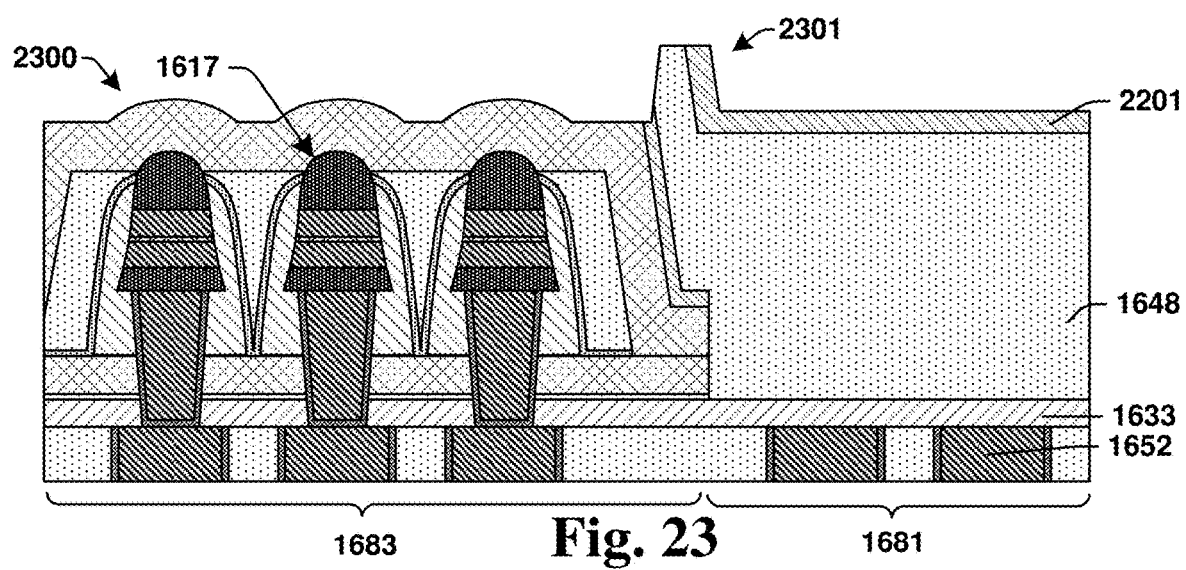

As shown by the cross-sectional view 2300 of FIG. 23, a mask may be used to selectively etch the logic interlevel dielectric layer 1648 and the NFARL 2201 from the memory region 1683. The etch may be a plasma etch. A buffing process may be used to reduce a height of the boundary structure 2301.

Figure 24:
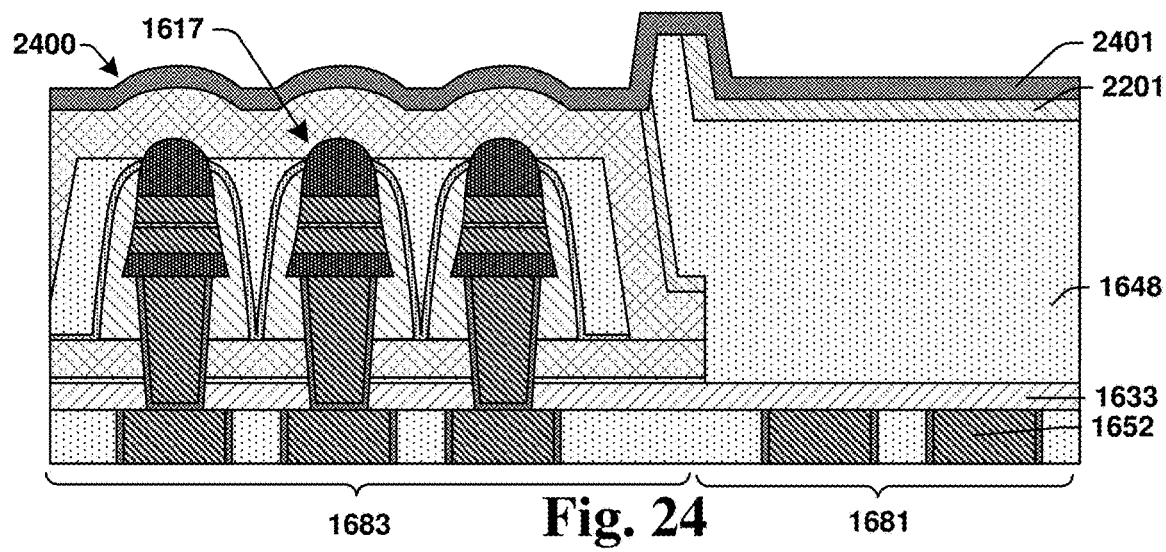

As shown by the cross-sectional view 2400 of FIG. 24, a hard mask 2401 may be formed over the structure shown by the cross-sectional view 2300 of FIG. 23. As shown by the cross-sectional view 2500 of FIG. 25, the hard mask 2401 may be patterned and used to form openings 2501 through and the NFARL 2201, the logic interlevel dielectric layer 1648, and the first etch stop layer 1633 through which the metal lines 1652 are exposed. The etching may proceed using a plurality of patterning and etch steps that together comprise a dual damascene process whereby the openings 2501 include a via portion 2505 and a trench portion 2503.

Figure 26:
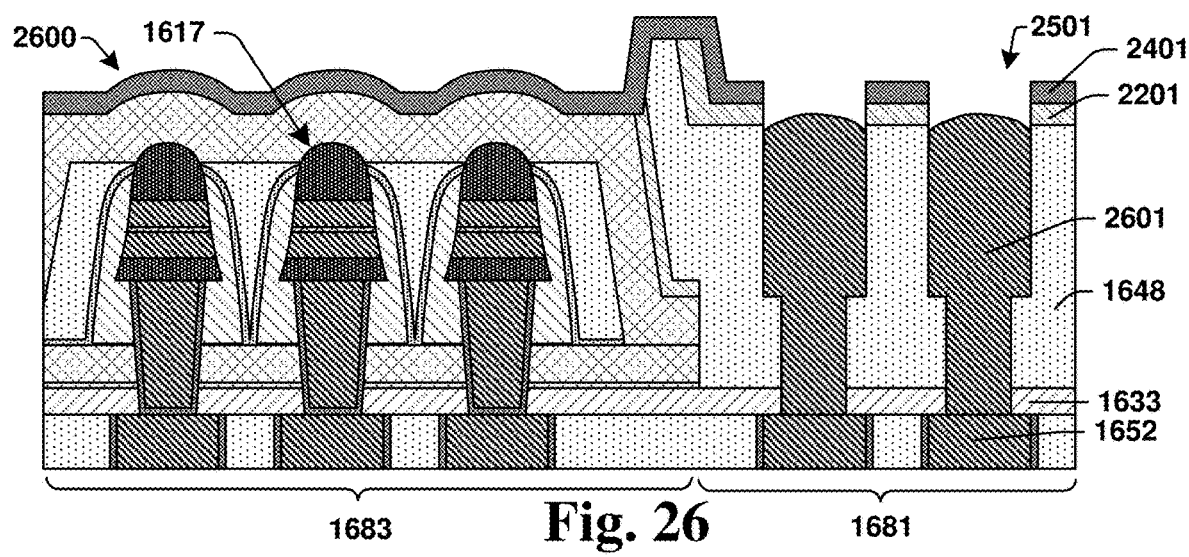

As shown by the cross-sectional view 2600 of FIG. 26, a process according to the present disclosure is carried out to cause metal material 2601 from the metal lines 1652 to migrate into the openings 2501. In this example, the process is terminated before the openings 2501 have completely filled with the metal material 2601.

Figure 27:
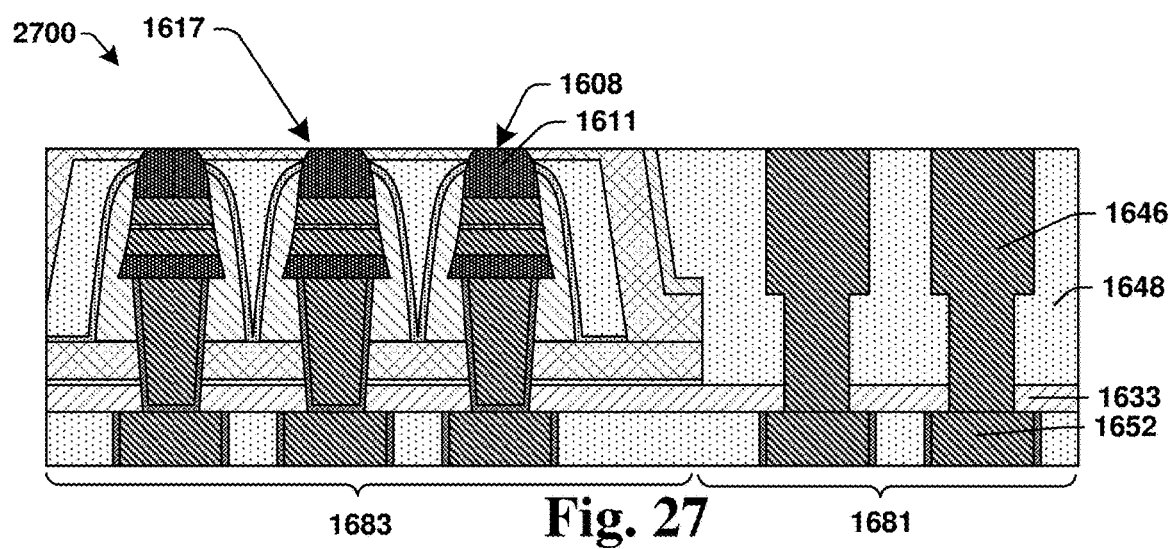
Figure 28:
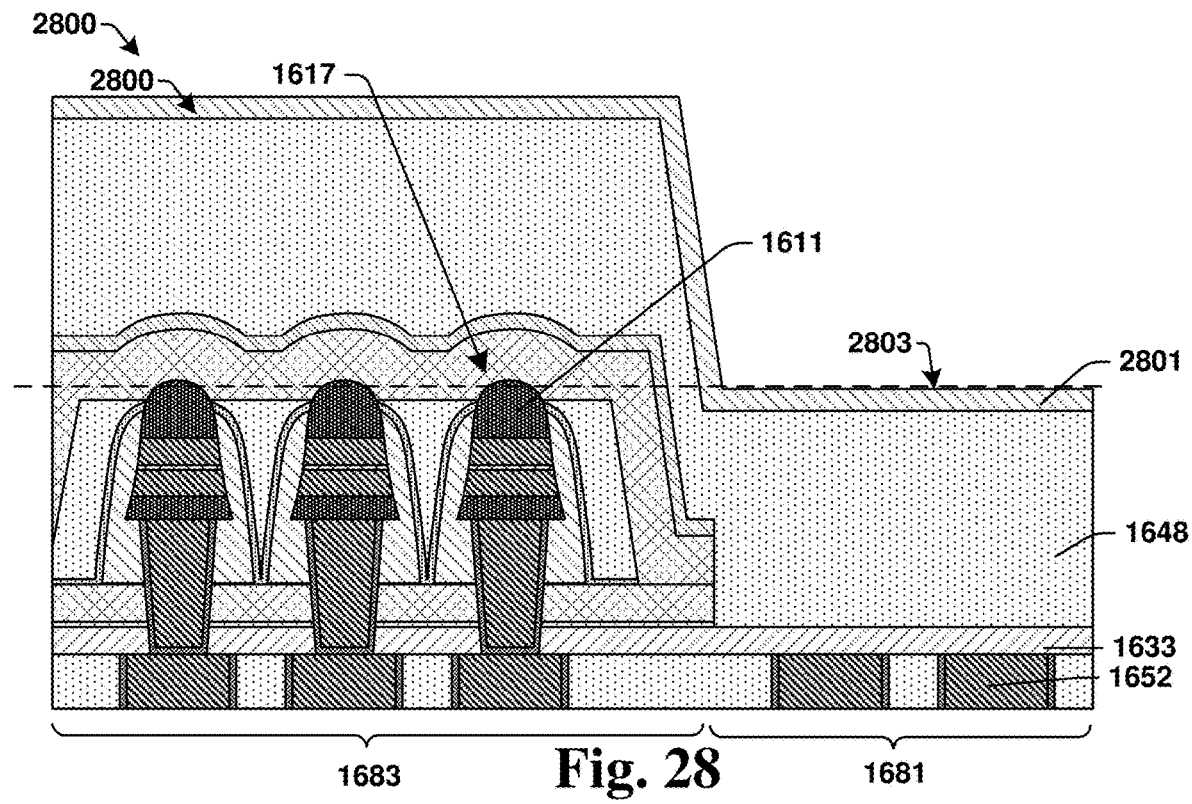
FIGS. 28-33 are a series of cross-sectional view illustrations exemplifying another method of forming a device according to some embodiments the present teachings.

As shown by the cross-sectional view 2700 of FIG. 27, a planarization process may be carried out to remove the hard mask 2401, remove the NFARL 2201, and form the second metal structures 1646 from the metal material 2601. The planarization process may be CMP or the like. In accordance with some embodiments, the planarization process also exposes the upper surfaces 1608 of the top electrodes 1611. Another metallization layer may be formed over the structure shown by the cross-sectional view 2700 of FIG. 27 to provide a device such as the integrated device 1600 of FIG. 16.

FIGS. 28-33 provide a series of cross-sectional views 2800-3300 illustrating a variation on the method illustrated by the cross-sectional views 2200-2700 of FIGS. 22-27. The variation begins with the cross-sectional view 2800 of FIG. 28, which is like the cross-sectional view 2200 of FIG. 22 except that in this example the logic interlevel dielectric layer 1648 has a lesser height and a CMP stop layer 2801 is formed immediately above the logic interlevel dielectric layer 1648. An upper surface 2803 of the CMP stop layer 2801 is vertically aligned with top electrodes 1611. Forming the logic interlevel dielectric layer 1648 and/or the CMP stop layer 2801 by ALD may facilitate this alignment.

Figure 25:
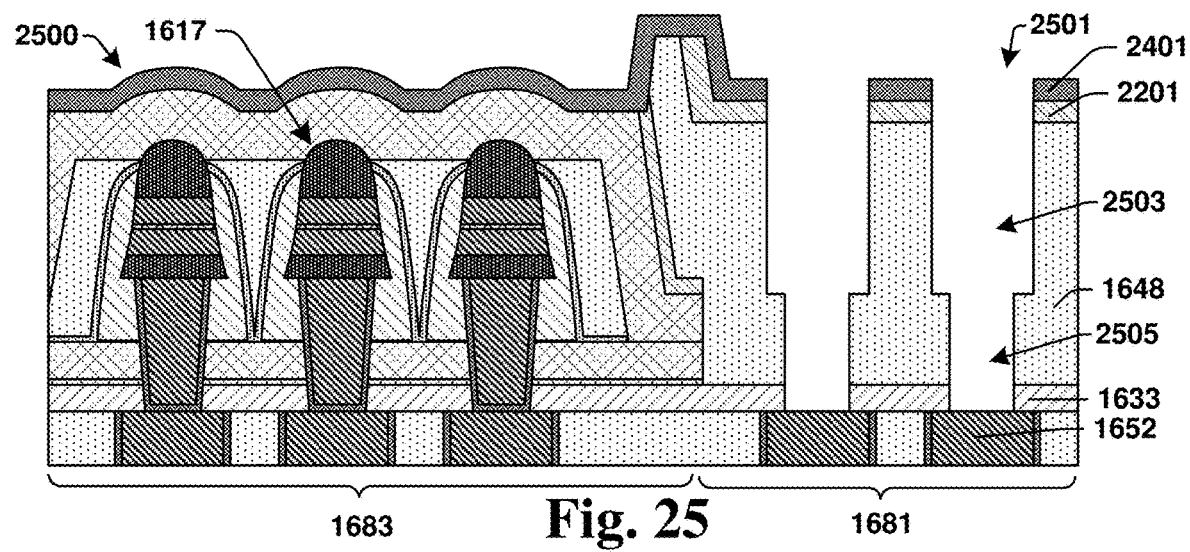
Figure 29:
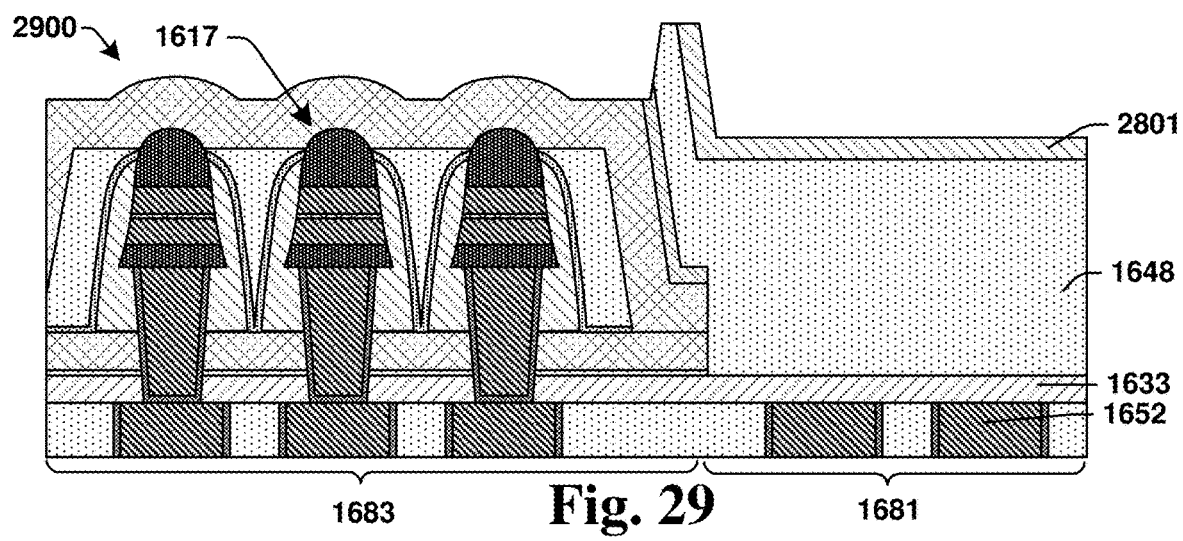
Figure 30:
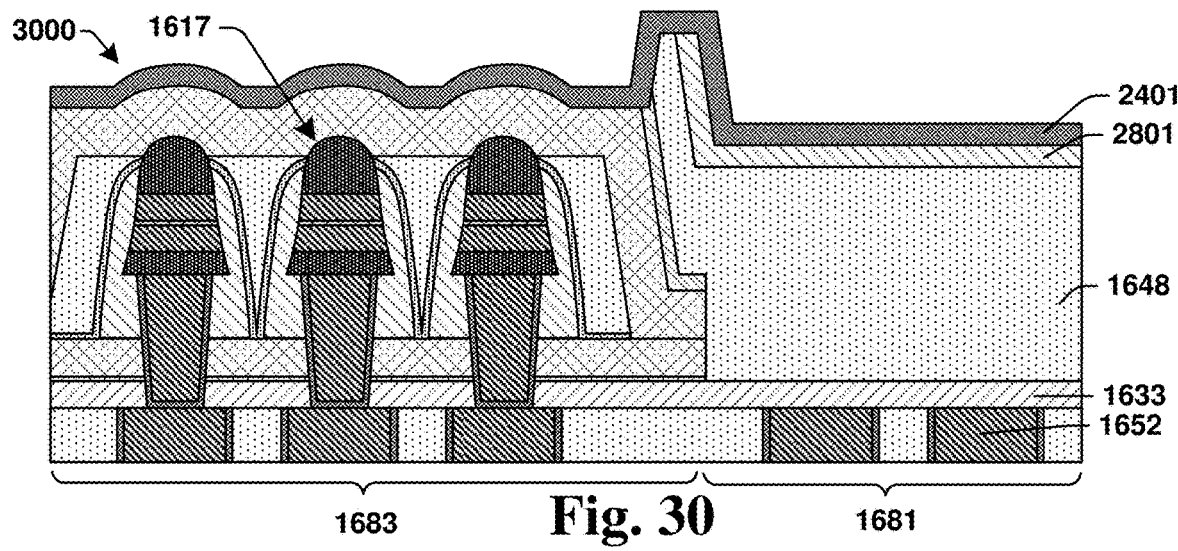
Figure 31:
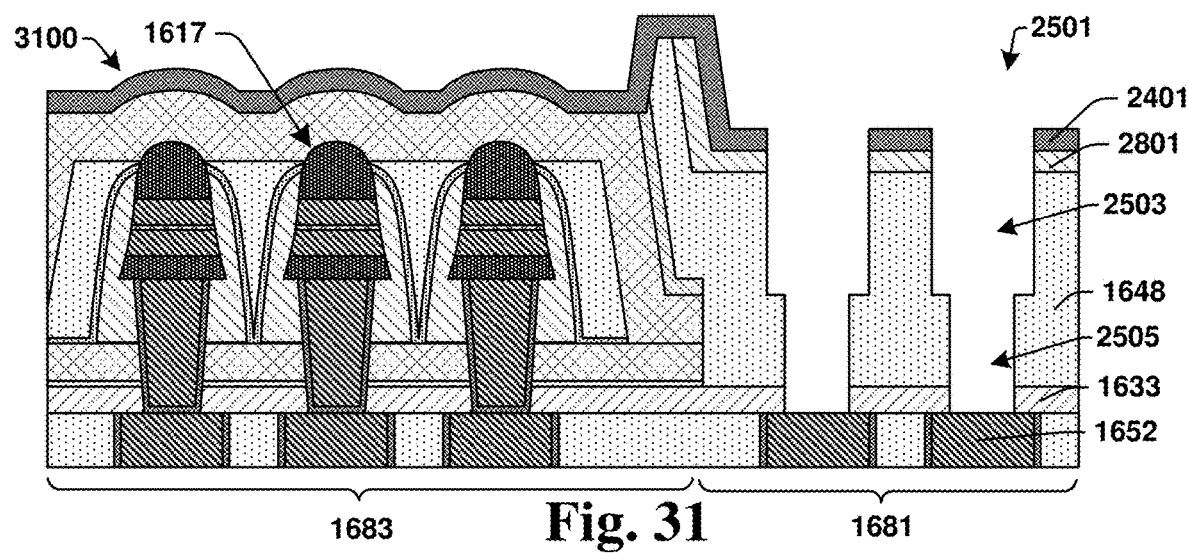
Figure 32:
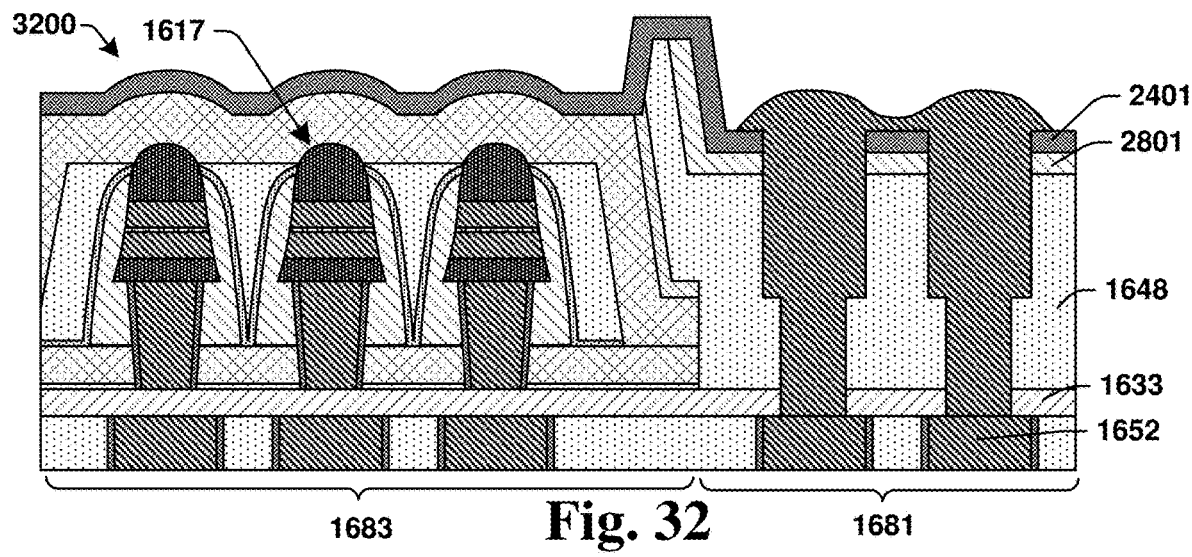
Figure 33:
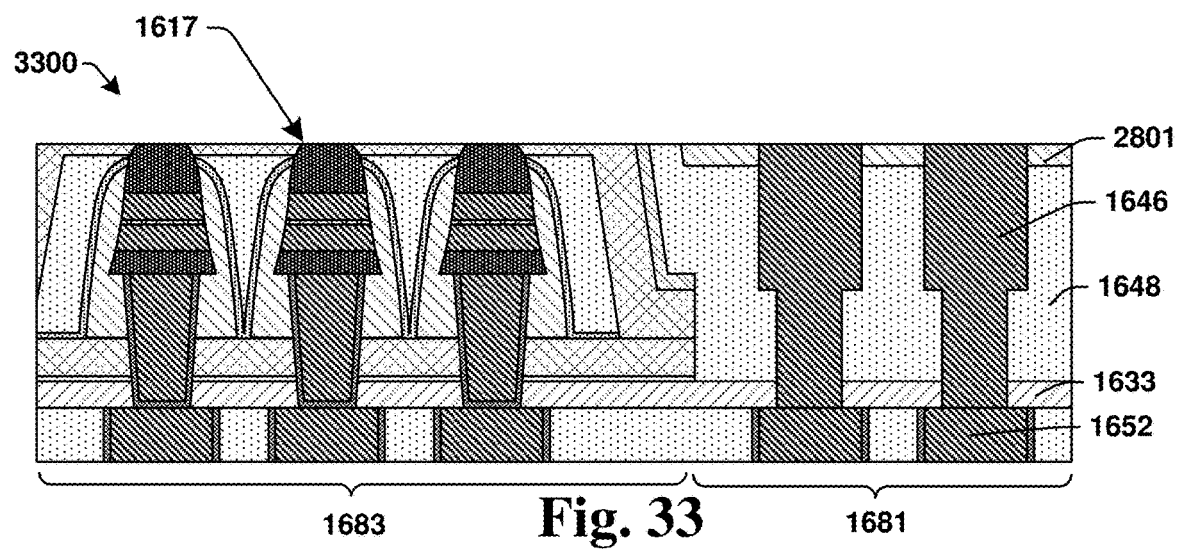

The series of cross-sectional views 2900-3100 of FIGS. 29-31 show that processing continues as it does though the series of cross-sectional views 2300-2500 of FIGS. 23-25. As shown by the cross-sectional view 3200 of FIG. 32, when the process is carried out that causes the metal material 2601 from the metal lines 1652 to migrate into the openings 2501, the process is continued until the openings 2501 have been completely filled and the metal material 2601 begins to deposit on the CMP stop layer 2801. As shown by the cross-sectional view 3300 of FIG. 33, a CMP process may be used to form the second metal structures 1646 from the metal material 2601 as in the process illustrated by the cross-sectional view 2700 of FIG. 27, the principal difference being that the CMP process may be controlled with the help of the CMP stop layer 2801 and the CMP stop layer 2801 may protect the logic interlevel dielectric layer 1648 from contamination with metal residue.

Some aspects of the present teachings relate to an integrated device having a first metal structure formed over a substrate and a second metal structure directly over and in contact with the first metal structure. The second metal structure has a smaller horizontal cross-section than the first metal structure. The second metal structure comprises a metal material of the first metal structure with a higher oxygen concentration than in the first metal structure.

Some aspects of the present teachings relate to an integrated device having a first metal structure in a first low-κ dielectric layer over the substrate and a second metal structure in a second low-κ dielectric layer. The second metal structure is directly over and in contact with the first metal structure. The first metal structure is separated from the first low-κ dielectric layer by a diffusion barrier layer while the second metal structure directly contacts the second low-κ dielectric layer.

Some aspects of the present teachings relate to method that includes receiving a substrate having a metal structure directly below a dielectric layer. An opening is formed in the dielectric layer to expose the metal structure. A gas is then provided that induces metal material from the metal structure to migrate into the opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
receiving a substrate having a metal structure directly below a dielectric layer;
forming an opening in the dielectric layer to expose the metal structure
providing a gas that induces metal material from the metal structure to migrate into the opening; and
chemical mechanical polishing that planarizes an upper surface of the metal material within the opening, wherein the chemical mechanical polishing exposes a top electrode of a memory cell.

2. The method of claim 1, wherein the metal material is copper.

3. The method of claim 1, wherein the gas comprises a hydrogen compound and an oxygen compound or a compound that comprises hydrogen and oxygen.

4. The method of claim 1, wherein the gas comprises water ($H_2O$) or hydrogen ($H_2$).

5. The method of claim 1, further comprising annealing the metal material that has migrated into the opening.

6. A method, comprising:
providing a substrate having a first region and a second region;
forming a first metallization layer over the substrate, wherein the first metallization layer comprises a wire;
forming an array of devices in the first region, wherein the devices include a top electrode;
depositing a dielectric layer in the second region, wherein the dielectric layer rises at least to a height of the top electrode;
forming a hole that goes through the dielectric layer, wherein the wire is exposed through the hole;
inducing metal from the wire to migrate into the hole so as to form a via in the hole, wherein inducing metal from the wire to migrate into the hole comprises alternately oxidizing and reducing the metal from the wire; and
planarizing, wherein planarizing makes upper surfaces of the via and the top electrode coplanar.

7. The method of claim 6, wherein inducing the metal from the wire to migrate into the hole comprises exposing the metal to an oxygen-containing gas.

8. The method of claim 6, wherein the devices comprise memory cells.

9. The method of claim 6, wherein the devices comprise magnetic tunnel junctions.

10. The method of claim 6, further comprising forming a second metallization layer, wherein the second metallization layer has contacts with the top electrode and with the via.

11. The method of claim 6, further comprising annealing the via prior to planarizing.

12. A method comprising:
providing a semiconductor substrate, wherein a wire comprising metal is disposed over the semiconductor substrate;
depositing a dielectric layer over the wire;
etching a hole through the dielectric layer, wherein the wire is exposed at a bottom of the hole;
exposing the wire to a gas, wherein the gas causes some of the metal in the wire to migrate upward into the hole by alternately oxidizing and reducing the metal, and the metal that migrates upward into the hole forms a metal structure in the hole.

13. The method of claim 12, further comprising chemical mechanical polishing, wherein after chemical mechanical polishing, the metal structure provides a via that goes through the dielectric layer and is coupled to the wire.

14. The method of claim 12, wherein the gas comprises a hydrogen compound and an oxygen compound and the wire comprises copper.

15. The method of claim 12, further comprising annealing, wherein annealing reduces an oxygen concentration gradient in the metal structure.

16. The method of claim 12, wherein the wire comprises copper and the dielectric layer is a low-k dielectric layer.

17. The method of claim 12, wherein the dielectric layer comprises an etch stop layer and a low-k dielectric layer over the etch stop layer, and the metal structure extends above the etch stop layer.

18. The method of claim 12, wherein alternately oxidizing and reducing the metal takes place at temperatures in the range from 50° C. to 200° C.

19. The method of claim 1, wherein the gas oxidizes the metal material to form metal oxide molecules.

20. The method of claim 19, wherein the gas reduces the metal oxide molecules.

* * * * *